United States Patent
Kothari et al.

(10) Patent No.: US 7,763,546 B2
(45) Date of Patent: Jul. 27, 2010

(54) METHODS FOR REDUCING SURFACE CHARGES DURING THE MANUFACTURE OF MICROELECTROMECHANICAL SYSTEMS DEVICES

(75) Inventors: Manish Kothari, Cupertino, CA (US); Jeffrey B. Sampsell, San Jose, CA (US)

(73) Assignee: Qualcomm MEMS Technologies, Inc., San Diego, CA (US)

( * ) Notice: Subject to any disclaimer, the term of this patent is extended or adjusted under 35 U.S.C. 154(b) by 600 days.

(21) Appl. No.: 11/462,026

(22) Filed: Aug. 2, 2006

(65) Prior Publication Data
US 2008/0029481 A1 Feb. 7, 2008

(51) Int. Cl.
*H01L 21/302* (2006.01)

(52) U.S. Cl. .............. 438/710; 438/706; 438/719; 216/22

(58) Field of Classification Search .............. 438/706, 438/710, 712, 714, 48, 49, 719; 216/58, 216/79, 22
See application file for complete search history.

(56) References Cited

U.S. PATENT DOCUMENTS

| | | | |
|---|---|---|---|
| 2,534,846 | A | 12/1950 | Ambrose et al. |
| 3,439,973 | A | 4/1969 | Paul et al. |
| 3,443,854 | A | 5/1969 | Weiss |
| 3,616,312 | A | 10/1971 | McGriff et al. |
| 3,653,741 | A | 4/1972 | Marks |
| 3,656,836 | A | 4/1972 | de Cremoux et al. |
| 3,725,868 | A | 4/1973 | Malmer, Jr. et al. |
| 3,813,265 | A | 5/1974 | Marks |
| 3,955,880 | A | 5/1976 | Lierke |
| 4,099,854 | A | 7/1978 | Decker et al. |
| 4,190,488 | A | 2/1980 | Winters |
| 4,196,396 | A | 4/1980 | Smith |
| 4,228,437 | A | 10/1980 | Shelton |
| 4,377,324 | A | 3/1983 | Durand et al. |
| 4,389,096 | A | 6/1983 | Hori et al. |
| 4,392,711 | A | 7/1983 | Moraw et al. |
| 4,403,248 | A | 9/1983 | te Velde |

(Continued)

FOREIGN PATENT DOCUMENTS

CH 681 047 12/1992

(Continued)

OTHER PUBLICATIONS

Yao et al., BrF3 dry release technology for large freestanding parylene microstructures and electrostatic actuators, Sensors and Actuators A, vol. 97-98, pp. 771-775, Apr. 2002.

(Continued)

*Primary Examiner*—Lan Vinh
(74) *Attorney, Agent, or Firm*—Knobbe Martens Olson & Bear LLP

(57) ABSTRACT

Provided herein are methods for preventing the formation and accumulation of surface-associated charges, and deleterious effects associated therewith, during the manufacture of a MEMS device. In some embodiments, methods provided herein comprise etching a sacrificial material in the presence of an ionized gas, wherein the ionized gas neutralizes charged species produced during the etching process and allows for their removal along with other etching byproducts. Also disclosed are microelectromechanical devices formed by methods of the invention, and visual display devices incorporating such devices.

8 Claims, 13 Drawing Sheets

U.S. PATENT DOCUMENTS

| | | |
|---|---|---|
| 4,441,791 A | 4/1984 | Hornbeck |
| 4,445,050 A | 4/1984 | Marks |
| 4,459,182 A | 7/1984 | te Velde |
| 4,482,213 A | 11/1984 | Piliavin et al. |
| 4,500,171 A | 2/1985 | Penz et al. |
| 4,519,676 A | 5/1985 | te Velde |
| 4,531,126 A | 7/1985 | Sadones |
| 4,560,435 A | 12/1985 | Brown et al. |
| 4,566,935 A | 1/1986 | Hornbeck |
| 4,571,603 A | 2/1986 | Hornbeck et al. |
| 4,596,992 A | 6/1986 | Hornbeck |
| 4,615,595 A | 10/1986 | Hornbeck |
| 4,617,608 A | 10/1986 | Blonder et al. |
| 4,662,746 A | 5/1987 | Hornbeck |
| 4,663,083 A | 5/1987 | Marks |
| 4,681,403 A | 7/1987 | te Velde et al. |
| 4,710,732 A | 12/1987 | Hornbeck |
| 4,748,366 A | 5/1988 | Taylor |
| 4,786,128 A | 11/1988 | Birnbach |
| 4,790,635 A | 12/1988 | Apsley |
| 4,856,863 A | 8/1989 | Sampsell et al. |
| 4,859,060 A | 8/1989 | Kitagirin et al. |
| 4,880,493 A | 11/1989 | Ashby et al. |
| 4,900,136 A | 2/1990 | Goldburt et al. |
| 4,900,395 A | 2/1990 | Syverson et al. |
| 4,937,496 A | 6/1990 | Neiger et al. |
| 4,954,789 A | 9/1990 | Sampsell |
| 4,956,619 A | 9/1990 | Hornbeck |
| 4,965,562 A | 10/1990 | Verhulst |
| 4,982,184 A | 1/1991 | Kirkwood |
| 5,018,256 A | 5/1991 | Hornbeck |
| 5,022,745 A | 6/1991 | Zahowski et al. |
| 5,028,939 A | 7/1991 | Hornbeck et al. |
| 5,037,173 A | 8/1991 | Sampsell et al. |
| 5,044,736 A | 9/1991 | Jaskie et al. |
| 5,061,049 A | 10/1991 | Hornbeck |
| 5,075,796 A | 12/1991 | Schildkraut et al. |
| 5,078,479 A | 1/1992 | Vuilleumier |
| 5,079,544 A | 1/1992 | DeMond et al. |
| 5,083,857 A | 1/1992 | Hornbeck |
| 5,096,279 A | 3/1992 | Hornbeck et al. |
| 5,099,353 A | 3/1992 | Hornbeck |
| 5,124,834 A | 6/1992 | Cusano et al. |
| 5,136,669 A | 8/1992 | Gerdt |
| 5,142,405 A | 8/1992 | Hornbeck |
| 5,142,414 A | 8/1992 | Koehler |
| 5,153,771 A | 10/1992 | Link et al. |
| 5,162,787 A | 11/1992 | Thompson et al. |
| 5,168,406 A | 12/1992 | Nelson |
| 5,170,156 A | 12/1992 | DeMond et al. |
| 5,172,262 A | 12/1992 | Hornbeck |
| 5,179,274 A | 1/1993 | Sampsell |
| 5,192,395 A | 3/1993 | Boysel et al. |
| 5,192,946 A | 3/1993 | Thompson et al. |
| 5,206,629 A | 4/1993 | DeMond et al. |
| 5,212,582 A | 5/1993 | Nelson |
| 5,214,419 A | 5/1993 | DeMond et al. |
| 5,214,420 A | 5/1993 | Thompson et al. |
| 5,216,537 A | 6/1993 | Hornbeck |
| 5,226,099 A | 7/1993 | Mignardi et al. |
| 5,228,013 A | 7/1993 | Bik |
| 5,231,532 A | 7/1993 | Magel et al. |
| 5,233,385 A | 8/1993 | Sampsell |
| 5,233,456 A | 8/1993 | Nelson |
| 5,233,459 A | 8/1993 | Bozler et al. |
| 5,254,980 A | 10/1993 | Hendrix et al. |
| 5,272,473 A | 12/1993 | Thompson et al. |
| 5,278,652 A | 1/1994 | Urbanus et al. |
| 5,280,277 A | 1/1994 | Hornbeck |
| 5,287,096 A | 2/1994 | Thompson et al. |
| 5,293,272 A | 3/1994 | Jannson et al. |
| 5,296,950 A | 3/1994 | Lin et al. |
| 5,299,041 A | 3/1994 | Morin et al. |
| 5,305,640 A | 4/1994 | Boysel et al. |
| 5,311,360 A | 5/1994 | Bloom et al. |
| 5,312,513 A | 5/1994 | Florence et al. |
| 5,323,002 A | 6/1994 | Sampsell et al. |
| 5,324,683 A | 6/1994 | Fitch et al. |
| 5,325,116 A | 6/1994 | Sampsell |
| 5,326,430 A | 7/1994 | Cronin et al. |
| 5,327,286 A | 7/1994 | Sampsell et al. |
| 5,330,617 A | 7/1994 | Haond |
| 5,331,454 A | 7/1994 | Hornbeck |
| 5,339,116 A | 8/1994 | Urbanus et al. |
| 5,345,328 A | 9/1994 | Fritz et al. |
| 5,347,377 A | 9/1994 | Revelli, Jr. et al. |
| 5,355,357 A | 10/1994 | Yamamori et al. |
| 5,358,601 A | 10/1994 | Cathey |
| 5,365,283 A | 11/1994 | Doherty et al. |
| 5,381,232 A | 1/1995 | van Wijk |
| 5,381,253 A | 1/1995 | Sharp et al. |
| 5,401,983 A | 3/1995 | Jokerst et al. |
| 5,411,769 A | 5/1995 | Hornbeck |
| 5,444,566 A | 8/1995 | Gale et al. |
| 5,446,479 A | 8/1995 | Thompson et al. |
| 5,448,314 A | 9/1995 | Heimbuch et al. |
| 5,452,024 A | 9/1995 | Sampsell |
| 5,454,906 A | 10/1995 | Baker et al. |
| 5,457,493 A | 10/1995 | Leddy et al. |
| 5,457,566 A | 10/1995 | Sampsell et al. |
| 5,459,602 A | 10/1995 | Sampsell |
| 5,459,610 A | 10/1995 | Bloom et al. |
| 5,461,411 A | 10/1995 | Florence et al. |
| 5,474,865 A | 12/1995 | Vasudev |
| 5,489,952 A | 2/1996 | Gove et al. |
| 5,497,172 A | 3/1996 | Doherty et al. |
| 5,497,197 A | 3/1996 | Gove et al. |
| 5,499,037 A | 3/1996 | Nakagawa et al. |
| 5,499,062 A | 3/1996 | Urbanus |
| 5,500,635 A | 3/1996 | Mott |
| 5,500,761 A | 3/1996 | Goossen et al. |
| 5,503,952 A | 4/1996 | Suzuki et al. |
| 5,506,597 A | 4/1996 | Thompson et al. |
| 5,515,076 A | 5/1996 | Thompson et al. |
| 5,517,347 A | 5/1996 | Sampsell |
| 5,523,803 A | 6/1996 | Urbanus et al. |
| 5,526,051 A | 6/1996 | Gove et al. |
| 5,526,172 A | 6/1996 | Kanack |
| 5,526,327 A | 6/1996 | Cordova, Jr. |
| 5,526,688 A | 6/1996 | Boysel et al. |
| 5,535,047 A | 7/1996 | Hornbeck |
| 5,548,301 A | 8/1996 | Kornher et al. |
| 5,551,293 A | 9/1996 | Boysel et al. |
| 5,552,924 A | 9/1996 | Tregilgas |
| 5,552,925 A | 9/1996 | Worley |
| 5,559,358 A | 9/1996 | Burns et al. |
| 5,563,398 A | 10/1996 | Sampsell |
| 5,567,334 A | 10/1996 | Baker et al. |
| 5,570,135 A | 10/1996 | Gove et al. |
| 5,579,149 A | 11/1996 | Moret et al. |
| 5,581,272 A | 12/1996 | Conner et al. |
| 5,583,688 A | 12/1996 | Hornbeck |
| 5,589,852 A | 12/1996 | Thompson et al. |
| 5,597,736 A | 1/1997 | Sampsell |
| 5,600,383 A | 2/1997 | Hornbeck |
| 5,602,671 A | 2/1997 | Hornbeck |
| 5,606,441 A | 2/1997 | Florence et al. |
| 5,608,468 A | 3/1997 | Gove et al. |
| 5,610,438 A | 3/1997 | Wallace et al. |
| 5,610,624 A | 3/1997 | Bhuva |
| 5,610,625 A | 3/1997 | Sampsell |
| 5,619,059 A | 4/1997 | Li et al. |
| 5,619,365 A | 4/1997 | Rhoads et al. |
| 5,619,366 A | 4/1997 | Rhoads et al. |

| | | | | | | |
|---|---|---|---|---|---|---|
| 5,622,814 | A | 4/1997 | Miyata et al. | 6,232,936 B1 | 5/2001 | Gove et al. |
| 5,629,790 | A | 5/1997 | Neukermans et al. | 6,243,149 B1 | 6/2001 | Swanson et al. |
| 5,633,652 | A | 5/1997 | Kanbe et al. | 6,246,398 B1 | 6/2001 | Koo |
| 5,636,052 | A | 6/1997 | Arney et al. | 6,249,039 B1 | 6/2001 | Harvey et al. |
| 5,636,185 | A | 6/1997 | Brewer et al. | 6,282,010 B1 | 8/2001 | Sulzbach et al. |
| 5,638,084 | A | 6/1997 | Kalt | 6,284,560 B1 | 9/2001 | Jech et al. |
| 5,638,946 | A | 6/1997 | Zavracky | 6,288,472 B1 | 9/2001 | Cabuz et al. |
| 5,641,391 | A | 6/1997 | Hunter et al. | 6,295,154 B1 | 9/2001 | Laor et al. |
| 5,646,768 | A | 7/1997 | Kaeiyama | 6,297,072 B1 | 10/2001 | Tilmans et al. |
| 5,647,819 | A | 7/1997 | Fujita et al. | 6,323,982 B1 | 11/2001 | Hornbeck |
| 5,650,834 | A | 7/1997 | Nakagawa et al. | 6,327,071 B1 | 12/2001 | Kimura et al. |
| 5,650,881 | A | 7/1997 | Hornbeck | 6,329,297 B1 | 12/2001 | Balish et al. |
| 5,654,741 | A | 8/1997 | Sampsell et al. | 6,335,831 B2 | 1/2002 | Kowarz et al. |
| 5,657,099 | A | 8/1997 | Doherty et al. | 6,351,329 B1 | 2/2002 | Greywal |
| 5,659,374 | A | 8/1997 | Gale, Jr. et al. | 6,356,254 B1 | 3/2002 | Kimura |
| 5,665,997 | A | 9/1997 | Weaver et al. | 6,359,673 B1 | 3/2002 | Stephenson |
| 5,673,139 | A | 9/1997 | Johnson | 6,376,787 B1 | 4/2002 | Martin et al. |
| 5,674,757 | A | 10/1997 | Kim | 6,377,233 B2 | 4/2002 | Colgan et al. |
| 5,683,591 | A | 11/1997 | Offenberg | 6,391,675 B1 | 5/2002 | Ehmke et al. |
| 5,703,710 | A | 12/1997 | Brinkman et al. | 6,392,233 B1 | 5/2002 | Channin et al. |
| 5,706,022 | A | 1/1998 | Hato | 6,392,781 B1 | 5/2002 | Kim et al. |
| 5,710,656 | A | 1/1998 | Goosen | 6,407,851 B1 | 6/2002 | Islam et al. |
| 5,719,068 | A | 2/1998 | Suzawa et al. | 6,447,126 B1 | 9/2002 | Hornbeck |
| 5,726,480 | A | 3/1998 | Pister | 6,448,622 B1 | 9/2002 | Franke et al. |
| 5,739,945 | A | 4/1998 | Tayebati | 6,452,465 B1 | 9/2002 | Brown et al. |
| 5,745,193 | A | 4/1998 | Urbanus et al. | 6,456,420 B1 | 9/2002 | Goodwin-Johansson |
| 5,745,281 | A | 4/1998 | Yi et al. | 6,465,355 B1 | 10/2002 | Horsley |
| 5,771,116 | A | 6/1998 | Miller et al. | 6,466,354 B1 | 10/2002 | Gudeman |
| 5,784,190 | A | 7/1998 | Worley | 6,466,358 B2 | 10/2002 | Tew |
| 5,784,212 | A | 7/1998 | Hornbeck | 6,473,274 B1 | 10/2002 | Maimone et al. |
| 5,793,504 | A | 8/1998 | Stoll | 6,480,177 B2 | 11/2002 | Doherty et al. |
| 5,808,780 | A | 9/1998 | McDonald | 6,496,122 B2 | 12/2002 | Sampsell |
| 5,818,095 | A | 10/1998 | Sampsell | 6,513,911 B1 | 2/2003 | Ozaki et al. |
| 5,822,110 | A | 10/1998 | Dabbaj | 6,522,801 B1 | 2/2003 | Aksyuk et al. |
| 5,822,170 | A | 10/1998 | Cabuz et al. | 6,531,945 B1 | 3/2003 | Ahn et al. |
| 5,824,608 | A | 10/1998 | Gotoch et al. | 6,545,335 B1 | 4/2003 | Chua et al. |
| 5,825,528 | A | 10/1998 | Goosen | 6,548,908 B2 | 4/2003 | Chua et al. |
| 5,835,255 | A | 11/1998 | Miles | 6,549,338 B1 | 4/2003 | Wolverton et al. |
| 5,838,484 | A | 11/1998 | Gossen et al. | 6,552,840 B2 | 4/2003 | Knipe |
| 5,842,088 | A | 11/1998 | Thompson | 6,574,033 B1 | 6/2003 | Chui et al. |
| 5,867,302 | A | 2/1999 | Fleming et al. | 6,577,785 B1 | 6/2003 | Spahn et al. |
| 5,896,796 | A | 4/1999 | Chih | 6,589,625 B1 | 7/2003 | Kothari et al. |
| 5,912,758 | A | 6/1999 | Knipe et al. | 6,600,201 B2 | 7/2003 | Hartwell et al. |
| 5,943,158 | A | 8/1999 | Ford et al. | 6,602,791 B2 | 8/2003 | Ouellet et al. |
| 5,959,763 | A | 9/1999 | Bozler et al. | 6,606,175 B1 | 8/2003 | Sampsell et al. |
| 5,967,163 | A | 10/1999 | Pan et al. | 6,608,268 B1 | 8/2003 | Goldsmith |
| 5,972,193 | A | 10/1999 | Chou et al. | 6,610,440 B1 | 8/2003 | LaFollette et al. |
| 5,976,902 | A | 11/1999 | Shih | 6,618,187 B2 | 9/2003 | Pilossof |
| 5,986,796 | A | 11/1999 | Miles et al. | 6,625,047 B2 | 9/2003 | Coleman, Jr. |
| 6,016,693 | A | 1/2000 | Viani et al. | 6,630,786 B2 | 10/2003 | Cummings et al. |
| 6,028,690 | A | 2/2000 | Carter et al. | 6,632,698 B2 | 10/2003 | Ives |
| 6,031,653 | A | 2/2000 | Wang | 6,635,919 B1 | 10/2003 | Melendez et al. |
| 6,038,056 | A | 3/2000 | Florence et al. | 6,642,913 B1 | 11/2003 | Kimura et al. |
| 6,040,937 | A | 3/2000 | Miles | 6,643,069 B2 | 11/2003 | Dewald |
| 6,049,317 | A | 4/2000 | Thompson et al. | 6,650,455 B2 | 11/2003 | Miles |
| 6,055,090 | A | 4/2000 | Miles et al. | 6,657,832 B2 | 12/2003 | Williams et al. |
| 6,057,903 | A | 5/2000 | Colgan et al. | 6,666,561 B1 | 12/2003 | Blakley |
| 6,061,075 | A | 5/2000 | Nelson et al. | 6,674,090 B1 | 1/2004 | Chua et al. |
| 6,099,132 | A | 8/2000 | Kaeriyama | 6,674,562 B1 | 1/2004 | Miles et al. |
| 6,100,872 | A | 8/2000 | Aratani et al. | 6,674,563 B2 | 1/2004 | Chui et al. |
| 6,113,239 | A | 9/2000 | Sampsell et al. | 6,680,792 B2 | 1/2004 | Miles |
| 6,115,326 | A | 9/2000 | Puma et al. | 6,687,896 B1 | 2/2004 | Royce et al. |
| 6,147,790 | A | 11/2000 | Meier et al. | 6,710,908 B2 | 3/2004 | Miles et al. |
| 6,158,156 | A | 12/2000 | Patrick | 6,713,235 B1 | 3/2004 | Ide et al. |
| 6,160,833 | A | 12/2000 | Floyd et al. | 6,720,267 B1 | 4/2004 | Chen et al. |
| 6,165,890 | A | 12/2000 | Kohl et al. | 6,736,987 B1 | 5/2004 | Cho |
| 6,166,422 | A | 12/2000 | Qian et al. | 6,741,377 B2 | 5/2004 | Miles |
| 6,180,428 | B1 | 1/2001 | Peeters et al. | 6,741,384 B1 | 5/2004 | Martin et al. |
| 6,194,323 | B1 | 2/2001 | Downey et al. | 6,741,503 B1 | 5/2004 | Farris et al. |
| 6,195,196 | B1 | 2/2001 | Kimura et al. | 6,743,570 B2 | 6/2004 | Harnett et al. |
| 6,201,633 | B1 | 3/2001 | Peeters et al. | 6,747,785 B2 | 6/2004 | Chen et al. |
| 6,204,080 | B1 | 3/2001 | Hwang | 6,747,800 B1 | 6/2004 | Lin |
| 6,215,221 | B1 | 4/2001 | Cabuz et al. | 6,756,317 B2 | 6/2004 | Sniegowski et al. |

| | | | | | |
|---|---|---|---|---|---|
| 6,768,097 B1 | 7/2004 | Viktorovitch et al. | 2002/0149828 A1 | 10/2002 | Miles |
| 6,775,174 B2 | 8/2004 | Huffman et al. | 2002/0160125 A1* | 10/2002 | Johnson et al. ............. 427/569 |
| 6,778,155 B2 | 8/2004 | Doherty et al. | 2002/0162569 A1* | 11/2002 | Kuo et al. .................... 134/1.1 |
| 6,778,306 B2 | 8/2004 | Sniegowski et al. | 2002/0168136 A1 | 11/2002 | Atia et al. |
| 6,782,166 B1 | 8/2004 | Grote et al. | 2003/0003682 A1* | 1/2003 | Moll et al. .................. 438/435 |
| 6,794,119 B2 | 9/2004 | Miles | 2003/0006468 A1 | 1/2003 | Ma et al. |
| 6,806,110 B2 | 10/2004 | Lester et al. | 2003/0029831 A1 | 2/2003 | Kawase |
| 6,811,267 B1 | 11/2004 | Allen et al. | 2003/0043157 A1 | 3/2003 | Miles |
| 6,812,482 B2 | 11/2004 | Fleming et al. | 2003/0054588 A1 | 3/2003 | Patel et al. |
| 6,819,469 B1 | 11/2004 | Koba | 2003/0062186 A1 | 4/2003 | Boroson et al. |
| 6,822,628 B2 | 11/2004 | Dunphy et al. | 2003/0072070 A1 | 4/2003 | Miles |
| 6,829,132 B2 | 12/2004 | Martin et al. | 2003/0090350 A1 | 5/2003 | Feng et al. |
| 6,853,129 B1 | 2/2005 | Cummings et al. | 2003/0112096 A1 | 6/2003 | Potter |
| 6,855,610 B2 | 2/2005 | Tung et al. | 2003/0138213 A1 | 7/2003 | Jin et al. |
| 6,859,218 B1 | 2/2005 | Luman et al. | 2003/0152872 A1 | 8/2003 | Miles |
| 6,861,277 B1 | 3/2005 | Monroe et al. | 2003/0201784 A1 | 10/2003 | Potter |
| 6,862,022 B2 | 3/2005 | Slupe | 2003/0202264 A1 | 10/2003 | Weber et al. |
| 6,862,029 B1 | 3/2005 | D'Souza et al. | 2003/0202265 A1 | 10/2003 | Reboa et al. |
| 6,867,896 B2 | 3/2005 | Miles | 2003/0202266 A1 | 10/2003 | Ring et al. |
| 6,870,581 B2 | 3/2005 | Li et al. | 2003/0231373 A1 | 12/2003 | Kowarz |
| 6,870,654 B2 | 3/2005 | Lin et al. | 2004/0010115 A1 | 1/2004 | Sotzing |
| 6,882,458 B2 | 4/2005 | Lin et al. | 2004/0027636 A1 | 2/2004 | Miles |
| 6,882,461 B1 | 4/2005 | Tsai et al. | 2004/0027701 A1 | 2/2004 | Ishikawa |
| 6,905,621 B2 | 6/2005 | Ho et al. | 2004/0028849 A1 | 2/2004 | Stark et al. |
| 6,912,022 B2 | 6/2005 | Lin et al. | 2004/0035821 A1 | 2/2004 | Doan et al. |
| 6,913,942 B2* | 7/2005 | Patel et al. ................... 438/48 | 2004/0038513 A1 | 2/2004 | Kohl et al. |
| 6,952,303 B2 | 10/2005 | Lin et al. | 2004/0051929 A1 | 3/2004 | Sampsell et al. |
| 6,953,702 B2 | 10/2005 | Miller et al. | 2004/0053434 A1 | 3/2004 | Bruner |
| 6,958,847 B2 | 10/2005 | Lin | 2004/0058532 A1 | 3/2004 | Miles et al. |
| 6,972,891 B2 | 12/2005 | Patel et al. | 2004/0061543 A1 | 4/2004 | Nam et al. |
| 6,980,350 B2 | 12/2005 | Hung et al. | 2004/0063322 A1 | 4/2004 | Yang |
| 6,982,820 B2 | 1/2006 | Tsai | 2004/0080807 A1 | 4/2004 | Chen et al. |
| 6,995,890 B2 | 2/2006 | Lin | 2004/0080832 A1 | 4/2004 | Singh |
| 6,999,225 B2 | 2/2006 | Lin | 2004/0087086 A1 | 5/2004 | Lee |
| 6,999,236 B2 | 2/2006 | Lin | 2004/0100677 A1 | 5/2004 | Huibers et al. |
| 7,008,812 B1 | 3/2006 | Carley | 2004/0124073 A1 | 7/2004 | Pilans et al. |
| 7,012,726 B1 | 3/2006 | Miles | 2004/0124483 A1 | 7/2004 | Partridge et al. |
| 7,027,202 B1 | 4/2006 | Hunter et al. | 2004/0124495 A1 | 7/2004 | Chen et al. |
| 7,041,224 B2 | 5/2006 | Patel et al. | 2004/0125281 A1 | 7/2004 | Lin et al. |
| 7,041,571 B2 | 5/2006 | Strane | 2004/0125282 A1 | 7/2004 | Lin et al. |
| 7,049,164 B2 | 5/2006 | Bruner | 2004/0125536 A1 | 7/2004 | Arney et al. |
| 7,078,293 B2 | 7/2006 | Lin et al. | 2004/0132243 A1 | 7/2004 | Kurosawa |
| 7,110,158 B2 | 9/2006 | Miles | 2004/0136076 A1 | 7/2004 | Tayebati |
| 7,119,945 B2 | 10/2006 | Cummings et al. | 2004/0145049 A1 | 7/2004 | McKinnell et al. |
| 7,123,216 B1 | 10/2006 | Miles | 2004/0145811 A1 | 7/2004 | Lin et al. |
| 7,172,915 B2 | 2/2007 | Lin et al. | 2004/0147056 A1 | 7/2004 | McKinnell et al. |
| 7,198,973 B2 | 4/2007 | Lin et al. | 2004/0147198 A1 | 7/2004 | Lin et al. |
| 7,221,495 B2 | 5/2007 | Miles et al. | 2004/0148009 A1 | 7/2004 | Buzzard |
| 7,256,107 B2 | 8/2007 | Takeuchi et al. | 2004/0150869 A1 | 8/2004 | Kasai |
| 7,321,457 B2 | 1/2008 | Heald | 2004/0160143 A1 | 8/2004 | Shreeve et al. |
| 7,446,926 B2 | 11/2008 | Sampsell | 2004/0161921 A1* | 8/2004 | Ryu ........................... 438/622 |
| 7,450,295 B2 | 11/2008 | Tung et al. | 2004/0174583 A1 | 9/2004 | Chen et al. |
| 2001/0003487 A1 | 6/2001 | Miles | 2004/0175577 A1 | 9/2004 | Lin et al. |
| 2001/0026951 A1 | 10/2001 | Vergani et al. | 2004/0179281 A1 | 9/2004 | Reboa |
| 2001/0040649 A1 | 11/2001 | Ozaki | 2004/0179445 A1 | 9/2004 | Park |
| 2001/0040675 A1 | 11/2001 | True et al. | 2004/0191937 A1 | 9/2004 | Patel et al. |
| 2002/0003400 A1* | 1/2002 | Lee ............................ 313/495 | 2004/0191946 A1 | 9/2004 | Patel et al. |
| 2002/0014579 A1 | 2/2002 | Dunfield | 2004/0197526 A1 | 10/2004 | Mehta |
| 2002/0015215 A1 | 2/2002 | Miles | 2004/0207897 A1 | 10/2004 | Lin |
| 2002/0021485 A1 | 2/2002 | Pilossof | 2004/0207898 A1 | 10/2004 | Lin et al. |
| 2002/0024711 A1 | 2/2002 | Miles | 2004/0209192 A1 | 10/2004 | Lin et al. |
| 2002/0027636 A1 | 3/2002 | Yamada | 2004/0209195 A1 | 10/2004 | Lin |
| 2002/0036304 A1 | 3/2002 | Ehmke et al. | 2004/0212026 A1 | 10/2004 | Van Brocklin et al. |
| 2002/0054424 A1 | 5/2002 | Miles | 2004/0217264 A1 | 11/2004 | Wood et al. |
| 2002/0055253 A1 | 5/2002 | Rudhard | 2004/0217378 A1 | 11/2004 | Martin et al. |
| 2002/0071169 A1 | 6/2002 | Bowers et al. | 2004/0217919 A1 | 11/2004 | Pichl et al. |
| 2002/0075555 A1 | 6/2002 | Miles | 2004/0218251 A1 | 11/2004 | Piehl et al. |
| 2002/0086455 A1 | 7/2002 | Franosch et al. | 2004/0218334 A1 | 11/2004 | Martin et al. |
| 2002/0110948 A1 | 8/2002 | Huang et al. | 2004/0218341 A1 | 11/2004 | Martin et al. |
| 2002/0117728 A1 | 8/2002 | Brosnihan et al. | 2004/0227493 A1 | 11/2004 | Van Brocklin et al. |
| 2002/0126364 A1 | 9/2002 | Miles | 2004/0240027 A1 | 12/2004 | Lin et al. |
| 2002/0135857 A1 | 9/2002 | Fitzpatrick et al. | 2004/0240032 A1 | 12/2004 | Miles |
| 2002/0137072 A1 | 9/2002 | Mirkin et al. | 2004/0240138 A1 | 12/2004 | Martin et al. |

| | | | | | | |
|---|---|---|---|---|---|---|
| 2004/0245588 | A1 | 12/2004 | Nikkel et al. | EP | 0878824 | 11/1998 |
| 2004/0263944 | A1* | 12/2004 | Miles et al. ............ 359/290 | EP | 1197778 A | 4/2002 |
| 2005/0001828 | A1 | 1/2005 | Martin et al. | EP | 1 209 738 | 5/2002 |
| 2005/0003667 | A1 | 1/2005 | Lin et al. | EP | 1258860 A1 | 11/2002 |
| 2005/0014374 | A1 | 1/2005 | Partridge et al. | EP | 1 452 481 A | 9/2004 |
| 2005/0020089 | A1 | 1/2005 | Shi et al. | JP | 49-004993 | 1/1974 |
| 2005/0024557 | A1 | 2/2005 | Lin | JP | 05275401 A1 | 10/1993 |
| 2005/0034822 | A1 | 2/2005 | Kim et al. | JP | 10-020328 | 1/1998 |
| 2005/0035699 | A1 | 2/2005 | Tsai | JP | 10500224 | 1/1998 |
| 2005/0036095 | A1 | 2/2005 | Yeh et al. | JP | 10-148644 | 6/1998 |
| 2005/0036192 | A1 | 2/2005 | Lin et al. | JP | 10-209176 | 8/1998 |
| 2005/0038950 | A1 | 2/2005 | Adelmann | JP | 10-267658 | 10/1998 |
| 2005/0042117 | A1 | 2/2005 | Lin | JP | 11211999 A | 8/1999 |
| 2005/0045276 | A1* | 3/2005 | Patel et al. ............ 156/345.43 | JP | 11243214 | 9/1999 |
| 2005/0046922 | A1 | 3/2005 | Lin et al. | JP | 2000-40831 A | 2/2000 |
| 2005/0046948 | A1 | 3/2005 | Lin | JP | 2001-085519 | 3/2001 |
| 2005/0057442 | A1 | 3/2005 | Way | JP | 2002-287047 | 3/2001 |
| 2005/0068583 | A1 | 3/2005 | Gutkowski et al. | JP | 2002 062493 | 2/2002 |
| 2005/0068605 | A1 | 3/2005 | Tsai | JP | 2002-207182 | 7/2002 |
| 2005/0068606 | A1 | 3/2005 | Tsai | JP | 2002-243937 | 8/2002 |
| 2005/0068608 | A1* | 3/2005 | Campbell et al. ............ 359/291 | JP | 2002-270575 | 9/2002 |
| 2005/0069209 | A1 | 3/2005 | Damera-Venkata et al. | JP | 2002-328313 | 11/2002 |
| 2005/0078348 | A1 | 4/2005 | Lin | JP | 2002-355800 | 12/2002 |
| 2005/0098840 | A1 | 5/2005 | Fuertsch et al. | JP | 2003-001598 | 1/2003 |
| 2005/0118832 | A1 | 6/2005 | Korzenski et al. | JP | 2004-102022 A | 4/2004 |
| 2005/0124135 | A1 | 6/2005 | Ayazi et al. | JP | 2004-133281 | 4/2004 |
| 2005/0168849 | A1 | 8/2005 | Lin | JP | 2004106074 A | 4/2004 |
| 2005/0170670 | A1 | 8/2005 | King et al. | JP | 2004-212656 | 7/2004 |
| 2005/0195462 | A1 | 9/2005 | Lin | JP | 2005-051007 | 2/2005 |
| 2005/0195467 | A1 | 9/2005 | Kothari et al. | KR | 2002-9270 | 10/1999 |
| 2005/0202649 | A1 | 9/2005 | Hung et al. | KR | 2000-0033006 | 6/2000 |
| 2005/0206993 | A1* | 9/2005 | Doan et al. ............ 359/291 | WO | WO 91/05284 | 4/1991 |
| 2006/0066932 | A1 | 3/2006 | Chui et al. | WO | WO 92/10925 | 6/1992 |
| 2006/0066935 | A1 | 3/2006 | Cummings et al. | WO | WO9530924 | 11/1995 |
| 2006/0076311 | A1 | 4/2006 | Tung et al. | WO | WO9717628 | 5/1997 |
| 2006/0077502 | A1 | 4/2006 | Tung et al. | WO | WO9952006 A2 | 10/1999 |
| 2006/0077503 | A1 | 4/2006 | Palmateer et al. | WO | WO9952006 A3 | 10/1999 |
| 2006/0077529 | A1 | 4/2006 | Chui et al. | WO | WO 01/14248 | 3/2001 |
| 2006/0119922 | A1 | 6/2006 | Faase et al. | WO | WO 01/63657 | 8/2001 |
| 2006/0177950 | A1 | 8/2006 | Lin | WO | WO 02/24570 | 3/2002 |
| 2006/0256420 | A1 | 11/2006 | Miles et al. | WO | WO 03/007049 A1 | 1/2003 |
| 2006/0257070 | A1 | 11/2006 | Lin et al. | WO | WO 03/052506 | 6/2003 |
| 2007/0111533 | A1 | 5/2007 | Korzenski et al. | WO | WO 03/069413 A | 8/2003 |
| 2007/0117396 | A1* | 5/2007 | Wu et al. ............ 438/710 | WO | WO03073151 A1 | 9/2003 |
| 2007/0155051 | A1 | 7/2007 | Wang et al. | WO | WO2004006003 A1 | 1/2004 |
| 2007/0196944 | A1 | 8/2007 | Chou et al. | WO | WO 2004/015741 | 2/2004 |
| 2007/0206267 | A1 | 9/2007 | Tung et al. | WO | WO2004026757 A2 | 4/2004 |
| 2007/0249078 | A1 | 10/2007 | Tung et al. | WO | WO 2004/055885 | 7/2004 |
| 2007/0249079 | A1 | 10/2007 | Sasagawa et al. | WO | WO 2004/079056 | 9/2004 |
| 2007/0249081 | A1 | 10/2007 | Luo et al. | WO | WO 2005/019899 A1 | 3/2005 |
| 2007/0269748 | A1 | 11/2007 | Miles | WO | WO 2005/061378 | 7/2005 |
| 2008/0026328 | A1 | 1/2008 | Miles | WO | WO 2005/085932 A | 9/2005 |
| 2008/0068699 | A1 | 3/2008 | Miles | WO | WO 2006/036385 | 4/2006 |
| 2008/0094687 | A1 | 4/2008 | Heald | WO | WO 2006/036437 | 4/2006 |
| 2008/0130089 | A1 | 6/2008 | Miles | WO | WO2006/036542 | 4/2006 |
| 2008/0157413 | A1 | 7/2008 | Lin | | | |
| 2008/0226929 | A1 | 9/2008 | Chung et al. | | | |
| 2009/0022884 | A1 | 1/2009 | Chui et al. | | | |
| 2009/0315567 | A1 | 12/2009 | Chou et al. | | | |
| 2009/0323168 | A1 | 12/2009 | Miles et al. | | | |

FOREIGN PATENT DOCUMENTS

| | | |
|---|---|---|
| CN | 157313 | 5/1991 |
| CN | 092109265 | 11/2003 |
| DE | 199 38 072 | 3/2000 |
| DE | 102 28 946 A | 1/2004 |
| EP | 0 035 299 | 9/1983 |
| EP | 0173808 | 3/1986 |
| EP | 0 667 548 A1 | 8/1995 |
| EP | 0694801 A | 1/1996 |
| EP | 0695959 A | 2/1996 |
| EP | 0 788 005 | 8/1997 |

OTHER PUBLICATIONS

Watanabe et al., Reduction of microtrenching and island formation in oxide plasma etching by employing electron beam charge neutralization, Applied Physics Letters, 79:17(2698-2700), Oct. 22, 2001.

ISR and WO for PCT/US07/016633 filed Jul. 23, 2007.

Aratani et al., "Process and Design Considerations for Surface Micromachined Beams for a Tuneable Interferometer Array in Silicon," Proc. IEEE Microelectromechanical Workshop, Fort Lauderdale, FL, pp. 230-235 (Feb. 1993).

Aratani et al., "Surface micromachined tuneable interferometer array," Sensors and Actuators, pp. 17-23. (1994).

Akasaka, "Three-Dimensional IC Trends," Proceedings of IEEE, vol. 74, No. 12, pp. 1703-1714, (Dec. 1986).

Austrian Search Report for EX64/2005 dated May 4, 2005.

Austrian Search Report for EX72/2005 dated May 13, 2005.

Austrian Search Report for EX81/2005 dated May 18, 2005.

Austrian Search Report for EX170/2005 dated Jul. 6, 2005.
Austrian Search Report for EX139/2005 dated Jul. 27, 2005.
Austrian Search Report for EX144/2005 dated Aug. 11, 2005.
Austrian Search Report dated Aug. 12, 2005.
Bains, "Digital Paper Display Technology Holds Promise for Portables," CommsDesign EE Times (2000).
Bass, Handbook of Optics, vol. 1, Fundamentals, Techniques, and Design, Second Edition, McGraw-Hill, inc. New York pp. 2.29/2.36 (1995).
Chu, et al. "Formation and Microstructures of Anodic Aluminoa Films from Aluminum Sputtered onglass Substrate" Journal of the Electrochemical Society, 149 (7) B321-B327 (2002).
Conner, "Hybrid Color Display Using Optical Interference Filter Array," SID Digest, pp. 577-580 (1993).
Crouse, "Self-ordered pore structure of anodized aluminum on silicon and pattern transfer" Applied Physics Letters, vol. 76, No. 1, Jan. 3, 2000. pp. 49-51.
EP 05255661.0 European Search Report (Dec. 30, 2005).
Fan et al., "Channel Drop Filters in Photonic Crystals," Optics Express, vol. 3, No. 1 (1998).
French, P.J. "Development of Surface Micromachining techniques compatable with on-chip electronics" Journal of Micromechanics and Microengineering vol. 6 No. 2, 197-211 XP 002360789 Jun. 1996 IOP Publishing.
Furneaux, et al. "The Formation of Controlled-porosity membranes from Anodically Oxidized Aluminium" Nature vo 337 Jan. 12, 1989, pp. 147-149.
Giles et al., "A Silicon MEMS Optical Switch Attenuator and Its Use in Lightwave Subsystems," IEEE Journal of Selected Topics in Quanum Electronics, vol. 5, No. 1, pp. 18-25, (Jan./Feb. 1999).
Goossen et al., "Possible Display Applications of the Silicon Mechanical Anti-Reflection Switch," Society for Information Display (1994).
Goossen et al., "Silicon Modulator Based on Mechanically-Active Anti-Reflection Layer with 1Mbit/sec Capability for Fiber-in-the-Loop Applications," IEEE Photonics Technology Letters, pp. 1119, 1121 (Sep. 1994).
Goossen K.W., "MEMS-Based Variable Optical Interference Devices", Optical MEMS, 2000 IEEE/Leos International Conference on Aug. 21-24, 2000, Piscataway, NJ, USA, IEE, Aug. 21, 2000, pp. 17-18.
Gosch, "West Germany Grabs the Lead in X-Ray Lithography," Electronics pp. 78-80 (Feb. 5, 1987).
Harnett et al., "Heat-depolymerizable polycarbonates as electron beam patternable sacrificial layers for nanofluidics," J. Vac. Sci. Technol. B 19(6), (Nov./Dec. 2001), pp. 2842-2845.
Howard et al., "Nanometer-Scale Fabrication Techniques," VLSI Electronics: Microstructure Science, vol. 5, pp. 145-153 and pp. 166-173 (1982).
Ibbotson et al., "Comparison of XeF2 and F-atom reactions with Si and SiO2," Applied Physics Letters, vol. 44, No. 12, pp. 1129-1131 (Jun. 1984).
Jackson "Classical Electrodynamics," John Wiley & Sons Inc., pp. 568-573. (date unknown).
Jerman et al., "A Miniature Fabry-Perot Interferometer with a Corrugated Silicon Diaphragm Support," (1988).
Jerman J. H. et al., "Maniature Fabry-Perot Interferometers Micromachined in Silicon for Use in Optical Fiber WDM Systems," Transducers. San Francisco, Jun. 24-27, 1991, Proceedings of the Internatioal Conference on Solid State Sensors Andactuators, New Youk IEEE, US, vol. Conf. 6, Jun. 24, 1991.
Joannopoulos et al., "Photonic Crystals: Molding the Flow of Light," Princeton University Press (1995).
Johnson, "Optical Scanners," Microwave Scanning Antennas, vol. 1, p. 251-261, (1964).
Kim et al., "Control of Optical Transmission Through Metals Perforated With Subwavelength Hole Arrays," Optic Letters, vol. 24, No. 4, pp. 256-257, (Feb. 1999).
Lee et al., "Electrostatic Actuation of Surface/Bulk Micromachined Single-Crystal Silicon Microresonators", International Conference on Intelligent Robots and Systems, vol. 2, pp. 1057-1062, (Oct. 17-21, 1999).

Lee et al., "The Surface/Bulk Micromachining (SBM) Process: A New Method for Fabricating Released MEMS in Single Crystal Silicon", Journal of Microelectromechanical Systems, vol. 8, Issue 4, pp. 409-416, (Dec. 1999).
Lieberman, "MEMS Display Looks to Give PDAs Sharper Image," EE Times (Feb. 11, 1997).
Lieberman, "Microbridges at Heart of New MEMS Displays," EE Times (Apr. 24, 1997).
Light over Matter, Circle No. 36 (Jun. 1993).
Lin et al., "Free-Space Micromachined Optical Switches for Optical Networking," IEEE Journal of Selected Topics in Quantum Electronics, vol. 5, No. 1, pp. 4-9. (Jan./Feb. 1999).
Little et al., "Vertically Coupled Microring Resonator Channel Dropping Filter," IEEE Photonics Technology Letters, vol. 11, No. 2, (1999).
Magel, "Integrated Optic Devices Using Micromachined Metal Membranes," SPIE vol. 2686, 0-8194-2060-Mar. 1996.
Maboudian, et al. Critical Review: Adhesion in Surface Micromechanical Structures: J. Vac. Sci Techno. B 15(1) Jan./Feb. 1997, pp. 1-20.
Microchem, LOR Lift-Off Resists Datasheet, 2002.
Miles, "Interferometric Modulation: MOEMS as an Enabling Technology for High-Performance Reflective Displays," Proceedings of the International Society for Optical Engineering, San Jose, CA, vol. 49085, pp. 131-139 (Jan. 28, 2003).
Miles, et al., "10.1: Digital Paper for Reflective Displays," 2002 SID International Symposium Digest of Technical Papers, Boston, MA, SID International Symposium Digest of Technical Papers, San Jose, CA, vol. 33/1, pp. 115-117 (May 21-23, 2002).
Miles, Mark, W., "A New Reflective FPD Technology Using Interferometric Modulation," The Proceedings of the Society for Information Display (May 11-16, 1997).
Nagami et al., "Plastic Cell Architecture: Towards Reconfigurable Computing for General-Purpose," IEEE, 0-8186-8900-, pp. 68-77, (May 1998).
Newsbreaks, "Quantum-trench devices might operate at terahertz frequencies," Laser Focus World (May 1993).
Oliner et al., "Radiating Elements and Mutual Coupling," Microwave Scanning Antennas, vol. 2, pp. 131-141, (1966).
Penta Vacuum MEMS Etcher Specifications, http://www.pentavacuum.com/memes.htm, Jan. 5, 2005.
Raley et al., "A Fabry-Perot Microinterferometer for Visible Wavelengths," IEEE Solid-State Sensor and Actuator Workshop, Jun. 1992, Hilton Head, SC.
Schnakenberg, et al. TMAHW Etchants for Silicon Micromachining. 1991 International Conference on Solid State Sensors and Actuators-Digest of Technical Papers. pp. 815-818.
Science and Technology, The Economist, pp. 89-90, (May 1999).
Search Report PCT/US02/13442 (Sep. 13, 2002).
Search Report PCT/US04/20330 (Nov. 8, 2004).
Search Report PCT/US05/031237.
Search Report PCT/US05/030033 and Written Opinion.
Search Report PCT/US05/030902 and Written Opinion.
Search Report and Written Opinion for PCT/US05/33558 (May 19, 2005).
Search Report PCT/US05/032331 (Jan. 9, 2006).
Search Report PCT/US05/032331 (Apr. 7, 2006).
Search Report and Written Opinion for PCT/US05/032647.
PCT/US05/029821 International Search Report (Dec. 27, 2005).
PCT/US05/030927 International Search Report (Jan. 25, 2006).
PCT/US05/031693 International Search Report.
PCT/US05/033558 Partial International Search Report (Feb. 24, 2006).
PCT/US2004/035820 International Search Report and Written Opinion (Apr. 11, 2005).
PCT/US96/17731 Search Report.
Sperger et al., "High Performance Patterned All-Dielectric Interference Colour Filter for Display Applications," SID Digest, pp. 81-83, (1994).
Sridharan et al. "Post-Packaging Release a New Concept for Surface-Micromachined Devices" Technical Digest, IEEE Solid-State Sensor & Actuator Workshop, New York, NY, US, Nov. 8, 1998, pp. 225-228, XP000992464.

Stone, "Radiation and Optics, An Introduction to the Classical Theory," McGraw-Hill, pp. 340-343, (1963).

Tayebi et al. "Reducing the Effects of adhesion and friction in microelectomechanical systesm (MEMS) through surface roughening: Comparision Between theory and experiments" http://jap.ajp.org/jap/copyright.isp Journal of applied Physics 98, 073528 (2005).

Thin Film Transistors—Materials and Processes—vol. 1 Amorphous Silicon Thin Film Transistors ed. Yue Kuo, Kluwer Academic Publishers, Boston (2004).

Walker et al., "Electron-beam-tunable Interference Filter Spatial Light Modulator," Optics Letters vol. 13, No. 5, pp. 345-347, (May 1988).

Williams et al., "Etch Rates for Micromachining Processing," Journal of Microelectromechanical Systems, vol. 5, No. 4, pp. 256-259 (Dec. 1996).

Winters et al., "The etching of silicon with XeF2 vapor. Applied Physics Letters," vol. 34, No. 1, pp. 70-73 (Jan. 1979).

Winton, "A novel way to capture solar energy," Chemical Week, (May 1985).

Wu, "Design of a Reflective Color LCD Using Optical Interference Reflectors," ASIA Display '95, pp. 929-931, (Oct. 1995).

Zhou et al., "Waveguide Panel Display Using Electromechanical Spatial Modulators" SID Digest, vol. XXIX, (1998).

Xactix Xetch X3™ Specifications, http://www.xactix.com/Xetch_X3specs.htm, Jan. 5, 2005.

Xactix Xetch™ Product Information.

IPRP for PCT/US07/016633 filed Jul. 23, 2007.

* cited by examiner

|  | Column Output Signals | |
|---|---|---|
|  | $+V_{bias}$ | $-V_{bias}$ |
| Row Output Signals  0 | Stable | Stable |
| $+\Delta V$ | Relax | Actuate |
| $-\Delta V$ | Actuate | Relax |

METHODS FOR REDUCING SURFACE CHARGES DURING THE MANUFACTURE OF MICROELECTROMECHANICAL SYSTEMS DEVICES

BACKGROUND

1. Field of the Invention

The invention relates generally to microelectromechanical systems (MEMS), and more particularly to interferometric modulators and display devices comprising such interferometric modulators.

2. Description of Related Art

Microelectromechanical systems (MEMS) include micromechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY

The systems, methods, and devices described herein each have several aspects, no single one of which is solely responsible for their desirable attributes. Without limiting the scope of these systems, methods, and devices, their more prominent features will now be discussed briefly. After considering this discussion, and particularly after reading the section entitled "Detailed Description of Certain Embodiments" one will understand how the features described herein provide advantages over established technology.

In various aspects, methods are provided for manufacturing a microelectromechanical systems (MEMS) device, wherein the methods reduce or prevent the accumulation of charges on surfaces of one or more structural elements of the MEMS device. In some aspects, methods are provided for etching a sacrificial layer, the methods including the steps of exposing a sacrificial material to a gas phase chemical etchant and an ionized gas, the ionized gas being substantially non-etching against the sacrificial material; and etching the sacrificial material, wherein the etching involves removing a substantial portion of the sacrificial material.

In some additional aspects, methods are provided for manufacturing a MEMS device, wherein the methods include the steps of depositing a sacrificial material on a substrate; depositing a structural material over the sacrificial material; and etching the sacrificial material. The etching involves exposing the sacrificial material to a gas phase chemical etchant and an ionized gas, wherein the ionized gas is substantially non-reactive with the sacrificial material.

In further aspects, MEMS devices are provided herein which are manufactured according to a method that includes the steps of depositing a sacrificial material on a substrate; depositing a structural material over the sacrificial material; and etching the sacrificial material. The etching in this embodiment involves exposing the sacrificial material to a gas phase chemical etchant and an ionized gas, wherein the ionized gas is substantially non-reactive with the sacrificial material.

In some additional aspects, an apparatus is provided that includes a plurality of MEMS devices manufactured according to methods described herein. In various embodiments, the apparatus may further include a display; a processor configured to process image data and communicate with the display; and a memory device configured to communicate with the processor.

These and other embodiments are described in more detail below.

DETAILED DESCRIPTION OF PREFERRED EMBODIMENTS

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

In several preferred aspects, methods are provided for reducing or preventing the formation of surface-associated electrical charges ("surface charges") during the manufacture of an interferometric modulator or other MEMS device, relative to established methods. In various embodiments, the formation of surface charges is reduced or prevented by etching sacrificial materials with a gas phase chemical etchant in the presence of an ionized gas. Etching in the presence of the ionized gas preferably neutralizes charged species produced during the etching process, which are then removed along with other etching byproducts. Advantageously, reducing surface charges according to methods provided herein yields improvements in one or more aspects of MEMS manufacturing methods and MEMS devices manufactured by such methods.

Figure 1:
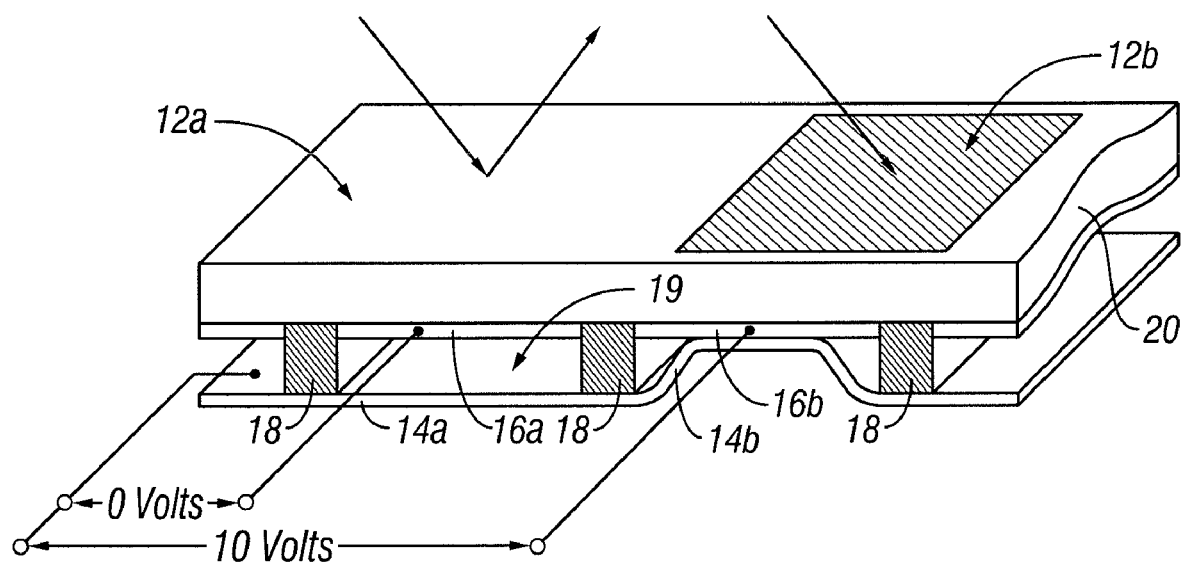
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise several fused layers, which can include an electrode layer, such as indium tin oxide (ITO), a partially reflective layer, such as chromium, and a transparent dielectric. The optical stack 16 is thus electrically conductive, partially transparent and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the cavity 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

Figure 2:
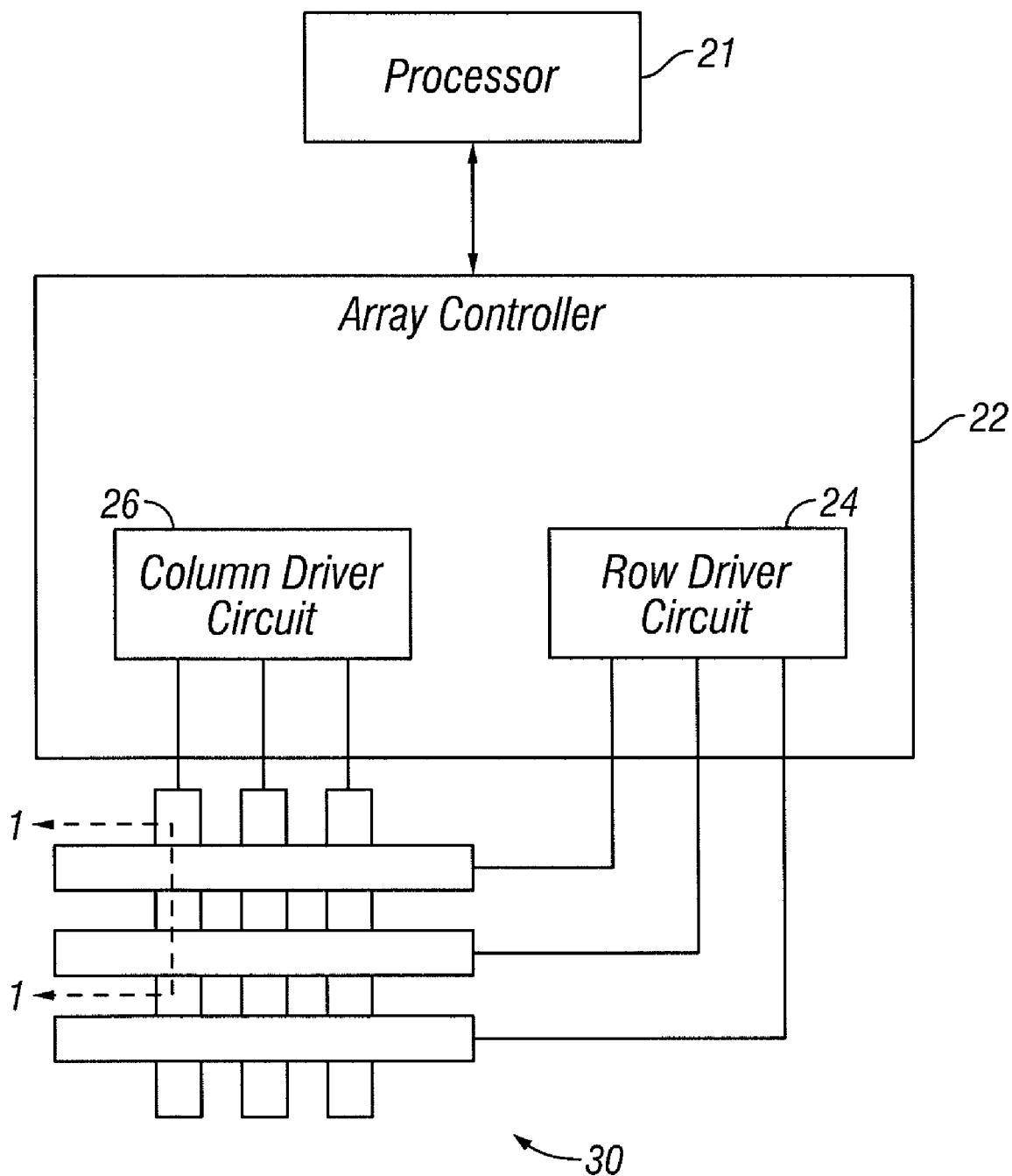
FIG. 2 is a system block diagram illustrating one embodiment of an electronic device incorporating a 3×3 interferometric modulator display.

FIGS. 2 through 5B illustrate one exemplary process and system for using an array of interferometric modulators in a display application. FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. There is thus a range of voltage, about 3 to 7 V in the example illustrated in FIG. 3, where there exists a window of applied voltage within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
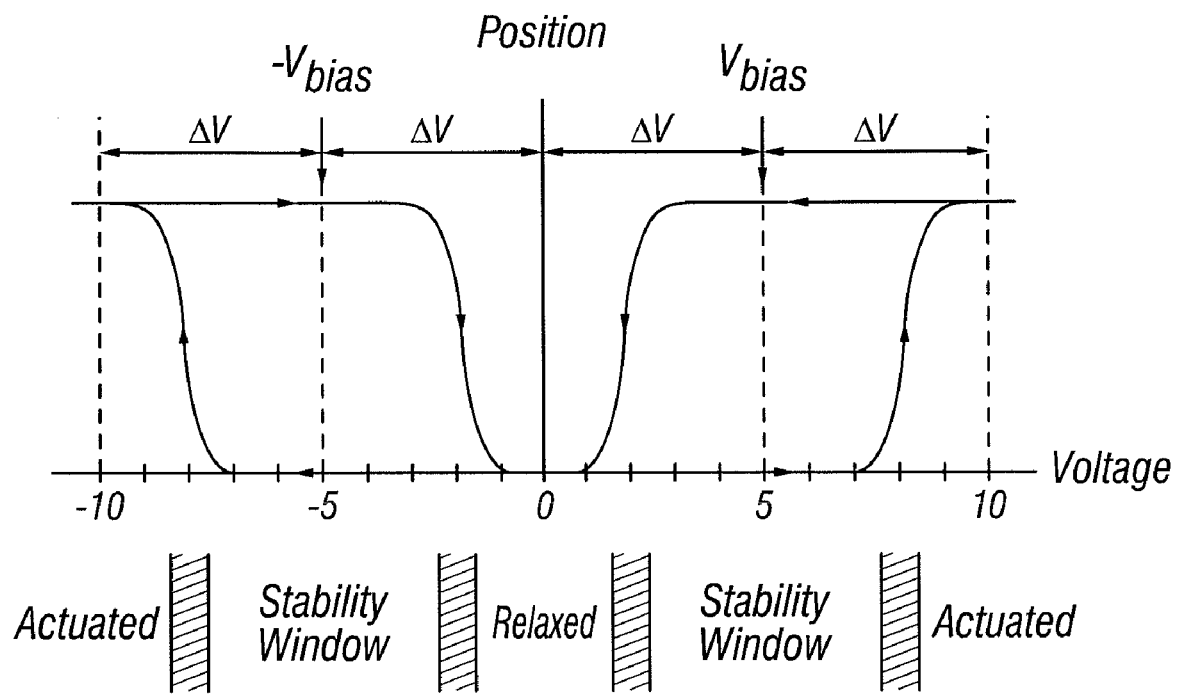
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.
Figure 5A:
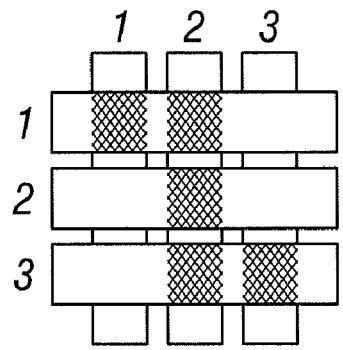
FIG. 5A illustrates one exemplary frame of display data in the 3×3 interferometric modulator display of FIG. 2.
Figure 5B:
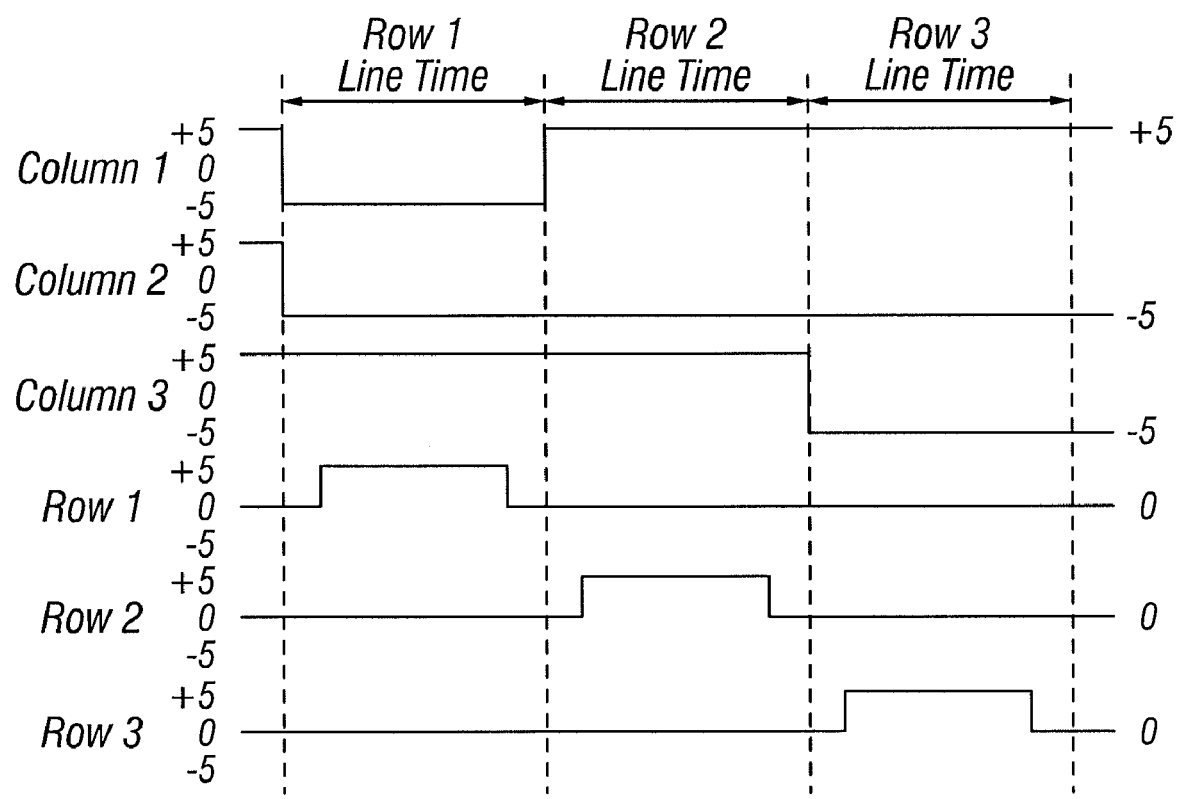
FIG. 5B illustrates one exemplary timing diagram for row and column signals that may be used to write the frame of FIG. 5A.

FIGS. 4, 5A, and 5B illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts respectively Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
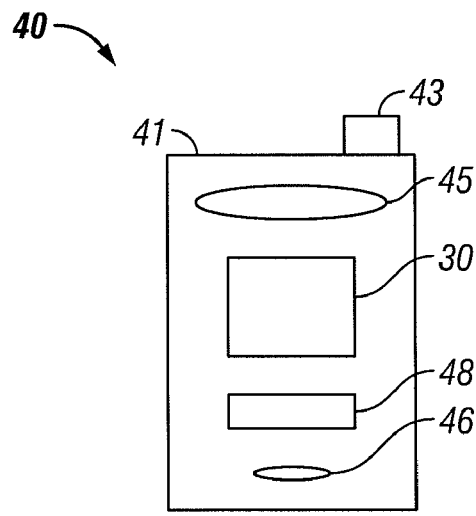
FIGS. 6A and 6B are system block diagrams illustrating an embodiment of a visual display device comprising a plurality of interferometric modulators.
Figure 6B:
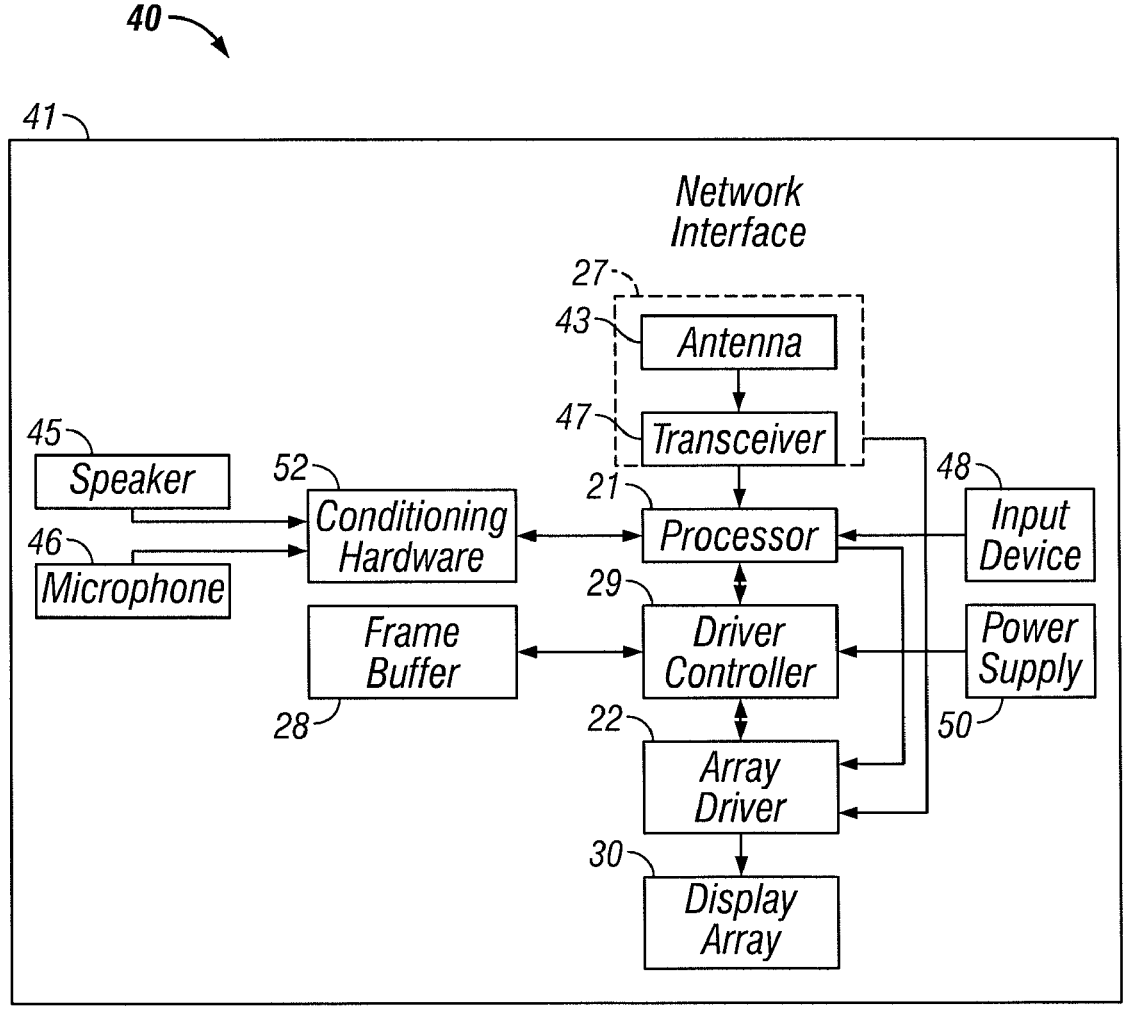

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes as are well known to those of skill in the art, including injection molding, and vacuum forming. In addition, the housing 41 may be made from any of a variety of materials, including but not limited to plastic, metal, glass, rubber, and ceramic, or a combination thereof. In one embodiment the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43 which is coupled to a transceiver 47. The transceiver 47 is connected to a processor 21, which is connected to conditioning hardware 52. The conditioning hardware 52 may be configured to condition a signal (e.g. filter a signal). The conditioning hardware 52 is connected to a speaker 45 and a microphone 46. The processor 21 is also connected to an input device 48 and a driver controller 29. The driver controller 29 is coupled to a frame buffer 28, and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one ore more device s over a network. In one embodiment the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a memory device, such as a digital video disc (DVD) or a hard-disc drive that contains image data, or a software module that generates image data.

Processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. Conditioning hardware 52 generally includes amplifiers and filters for transmitting signals to the speaker 45, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, input device 48 includes a keypad, such as a QWERTY keyboard or a telephone keypad, a button, a switch, a touch-sensitive screen, a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

Power supply 50 can include a variety of energy storage devices as are well known in the art. For example, in one embodiment, power supply 50 is a rechargeable battery, such as a nickel-cadmium battery or a lithium ion battery. In another embodiment, power supply 50 is a renewable energy source, a capacitor, or a solar cell, including a plastic solar cell, and solar-cell paint. In another embodiment, power supply 50 is configured to receive power from a wall outlet.

In some implementations control programmability resides, as described above, in a driver controller which can be located in several places in the electronic display system. In some cases control programmability resides in the array driver 22. Those of skill in the art will recognize that the above-described optimization may be implemented in any number of hardware and/or software components and in various configurations.

Figure 7A:
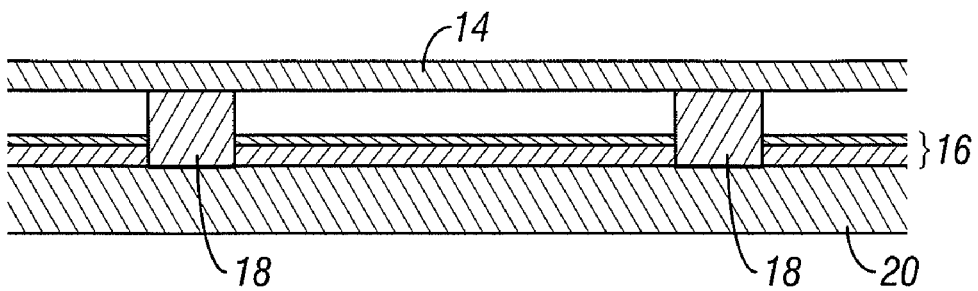
FIG. 7A is a cross section of the device of FIG. 1.
Figure 7B:
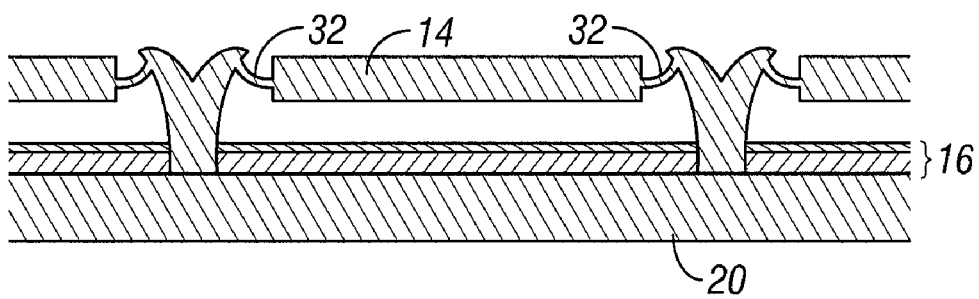
FIG. 7B is a cross section of an alternative embodiment of an interferometric modulator.
Figure 7C:
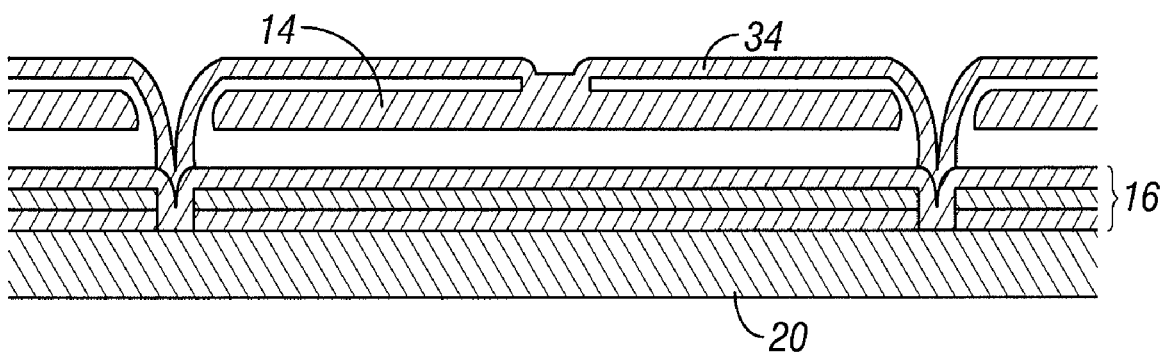
FIG. 7C is a cross section of another alternative embodiment of an interferometric modulator.
Figure 7D:
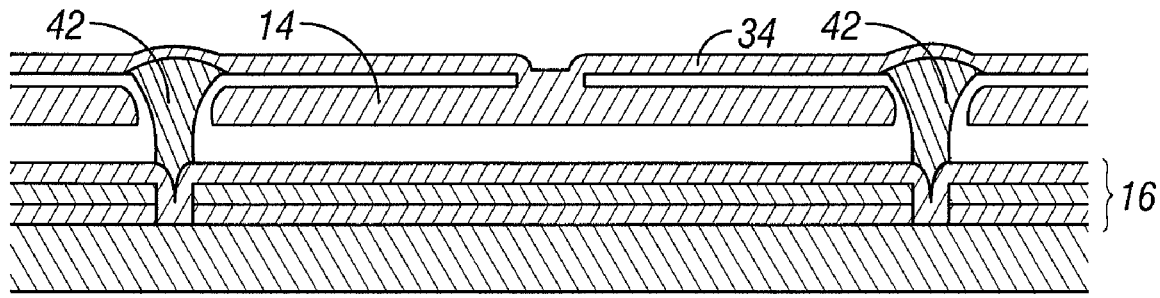
FIG. 7D is a cross section of yet another alternative embodiment of an interferometric modulator.
Figure 7E:
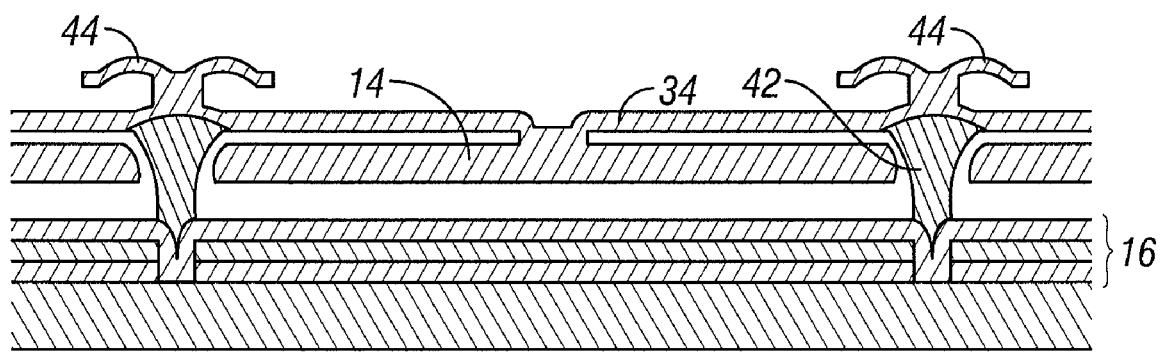
FIG. 7E is a cross section of an additional alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 is attached to supports at the corners only, on tethers 32. In FIG. 7C, the moveable reflective layer 14 is suspended from a deformable layer 34, which may comprise a flexible metal. The deformable layer 34 connects, directly or indirectly, to the substrate 20 around the perimeter of the deformable layer 34. These connections are herein referred to as support posts. The embodiment illustrated in FIG. 7D has support post plugs 42 upon which the deformable layer 34 rests. The movable reflective layer 14 remains suspended over the cavity, as in FIGS. 7A-7C, but the deformable layer 34 does not form the support posts by filling holes between the deformable layer 34 and the optical stack 16. Rather, the support posts are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

Figure 8A:
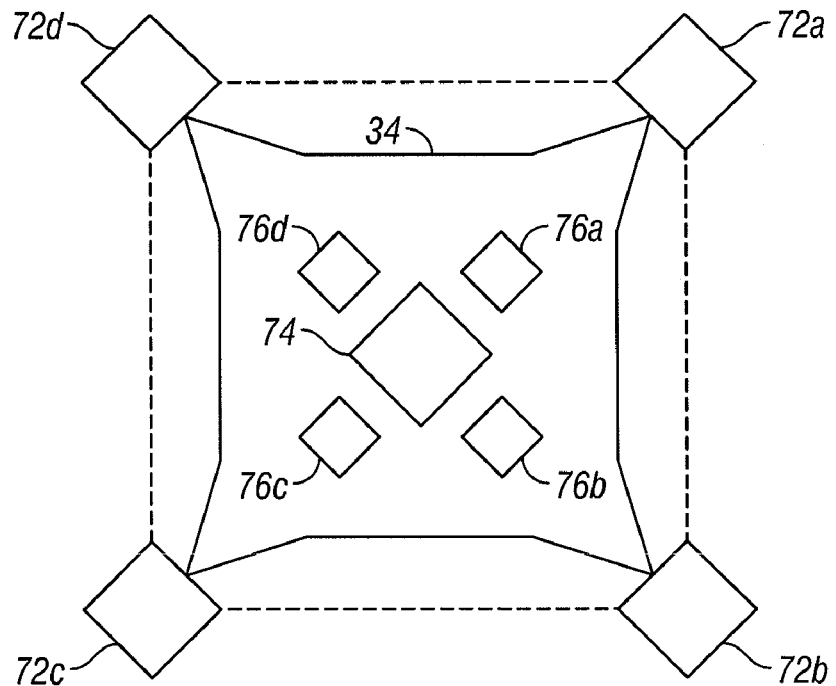
FIG. 8A is a schematic diagram illustrating an embodiment of a back plane support for a separable interferometric modulator.
Figure 8B:
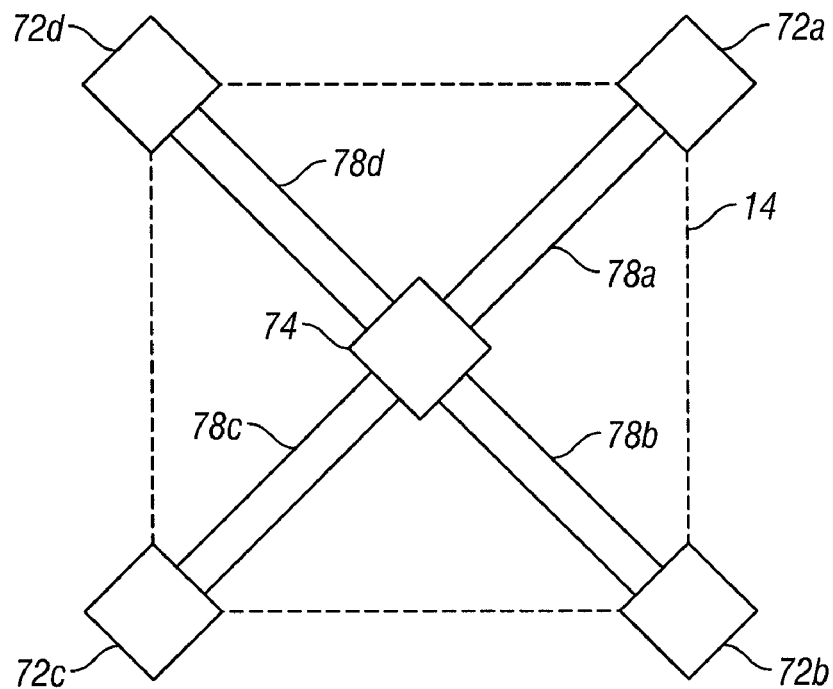
FIG. 8B is a schematic diagram illustrating an alternative embodiment of a back plane of a separable interferometric modulator.

Two possible configurations for the deformable layer 34 are shown in FIGS. 8A and 8B, which depict views from the back of the modulator, which may also be seen as the bottom of the modulator shown in FIG. 1, or the top of the modulators shown in FIGS. 7A-7E. In FIG. 8A, the deformable layer 34 is in the form of a flexible membrane supported at its corners by support posts 72a-d, which are anchored in the substrate 20 and/or a layer above the substrate 20, such as the optical stack 16 (see cross-sectional views of FIG. 7). In the embodiments illustrated in FIGS. 7D and 7E, the support posts 72a-d include the support post plugs 42. The deformable layer 34 connects to the underlying reflective layer 14, demarcated by the dotted line in FIG. 8A, via a large center back support 74 and four smaller surrounding supports 76a-d. The back support 74 and the surrounding supports 76a-d can be comprised of the same planarization material as support post plugs 42, or of any suitable material. The deformable layer 34 suspends the reflective layer 14 over the optical stack. Alternatively, in FIG. 8B, the deformable layer 34 is patterned to form thin, linear straps 78a-d connected to each support post 72a-d. The straps are attached to the reflective layer 14 by the center support 74. The configurations of FIGS. 8A and 8B are two alternatives, among many possibilities. Interferometric modulators useful in the invention may comprise any configuration that gives the desired freedom of movement to the reflective layer 14 and the desired mechanical characteristics of that movement.

In several aspects, methods are provided herein for manufacturing MEMS devices, including but not limited to interferometric modulators, wherein the methods yield substantial improvements in one or more aspects of MEMS manufacturing processes and/or MEMS devices made by such methods. Methods described herein can be practiced in conjunction with any number of methods known in the semiconductor, integrated circuit, and/or MEMS fields. Methods provided herein typically involve a series of material deposition, patterning, and etching steps, along with various additional steps, such as cleaning, masking, removing, washing, doping, charging, heating, cooling, moving, storing, connecting (e.g., to other components), testing, and the like. Examples of suitable techniques are described, for example, in U.S. Pat. No. 6,040,937 and U.S. Patent Application No. 2004/0051929. Methods for manufacturing a particular device may entail significant variations from established methods, however, depending for example on the type and configuration of the device being manufactured.

A significant problem in the manufacture of MEMS devices is the accumulation of surface-associated electrical charges ("surface charges"), which can lead to a variety of manufacturing and/or performance issues. For example, accumulated surface charges can attract and hold particulate contaminants that interfere with optical, mechanical, and/or other aspects of MEMS devices. Surface charges can also cause electrostatic discharge (ESD) events, which can permanently damage circuitry and/or other components. Surface charge-related problems may be manifested as manufacturing defects, which can decrease production efficiency and/or product quality, and/or as "latent" defects, which can cause system failures or other problems at various post-manufacturing stages, such as product packaging, transport, storage, and/or use. Latent defects are particularly problematic, due, for example, to difficulties in detecting defective products and diagnosing related reliability and/or performance issues.

MEMS devices manufactured by established methods typically accumulate a substantial number of surface charges, requiring additional processing steps to remove such surface charges and/or reduce their deleterious effects. A variety of methods for addressing surface charges in MEMS devices are known in the art (e.g., in the art of semiconductor manufacturing). For example, MEMS manufacturing processes typically incorporate materials and/or handling steps for discharging surface charges by grounding one or more components of a MEMS device. Although grounding can successfully eliminate some surface charges, other surface charges, such as those associated with insulating materials (e.g., dielectric layers) or with conductive materials that are structurally inaccessible, are not susceptible to discharge by grounding. Devices can also be exposed to ionized air or another ionized gas, for example in a "clean room" or a microenvironment therein, in order to neutralize surface charges. While ionization methods can effectively dissipate some surface charges, others are resistant to neutralization, such as those residing on surfaces isolated from the surrounding environment. Moreover, the accumulation of surface charges and/or their subsequent neutralization can alter surface chemistries or other material properties, and thereby negatively effect optical, mechanical, and/or other properties of MEMS devices.

In addition to the above methods for eliminating surface charges, a wide range of techniques have been developed to counteract or compensate for the effects of surface charges on the manufacture and operation of MEMS devices. Such methods include, for example, the incorporation of additional layers and coatings (e.g., insulating layers, anti-stiction coatings), the incorporation of additional structures (e.g., stiction bumps), limitations on operational parameters (e.g., actuation voltages), and/or other modifications. These methods are typically costly, time-consuming, and only partially effective. Accordingly, preventing the accumulation of surface charges according to methods described herein can provide a host of improvements in MEMS devices and manufacturing processes.

In some aspects, the formation of surface charges on one or more structural elements of a MEMS device is reduced or prevented via methods provided herein for etching a sacrificial material. Without being limited to a particular theory, it is believed that a primary mechanism underlying the accumulation of surface charges on MEMS devices is triboelectric charging, whereby charge transfer occurs between two or more surfaces that come into contact and then separate during the manufacturing process. Etching processes are particularly problematic with regard to surface charges, since they typically involve the removal of sacrificial materials that have extensive contacts with structural or other materials. The term "sacrificial" is used herein according to its ordinary meaning (s), for example to describe materials that are removed in the course of manufacturing a MEMS device (e.g., a sacrificial material) and/or structures comprising such materials (e.g., a sacrificial layer). In various embodiments, the separation of surface contacts between a sacrificial material and structural materials comprising a MEMS device results in triboelectric charging of the surfaces, for example via the donation and acceptance of electrons between the surfaces to produce local regions of positive and negative charge. In addition, charged species created via chemical etching, as well as charged contaminants, can adsorb, condense (physisorb), chemisorb, and/or otherwise adhere to one or more surfaces of a MEMS device.

In some aspects, methods provided herein prevent or reduce the formation and/or accumulation of surfaces charges by etching sacrificial materials with a gas phase chemical etchant in the presence of an ionized gas, wherein the ionized gas is preferably substantially non-etching against the sacrificial material and/or the materials comprising the MEMS device. Without being bound by a particular theory, it is believed that etching in the presence of an ionized gas neutralizes charged species that would otherwise adhere to one or more surfaces of the device. In various embodiments, charge-neutralized species do not substantially adhere to surfaces of the MEMS device, but rather are removed along with other byproducts of the etching process, for example via a vacuum source. In contrast to established methods, methods provided herein can prevent the initial formation of surface charges, as opposed to removing or compensating for surface charges after they have formed. Advantageously, methods provided herein may yield improvements in efficiency, cost, assembly time, accuracy, reproducibility (e.g., lower tolerances) and/or other aspects of MEMS manufacturing methods. Also provided herein are MEMS devices having reduced levels of surface charges and systems comprising such devices. In various embodiments, such devices and systems exhibit improved durability, reliability, performance, and/or other aspects relative to devices and systems manufactured by other methods.

Layers, coatings, and/or other structural elements may be described herein as being "on" (e.g., deposited on, or formed on), "over", "above", "adjacent", "between", etc. in relation to other structural elements. As used herein, these terms can mean directly and/or indirectly on, over, above, adjacent, between, etc., as a variety of intermediate layers and/or other structural elements can be interposed between structural elements recited herein. Similarly, structural elements recited herein, such as substrates or layers, can comprise a single component (e.g., a monolayer) or a multi-component structure (e.g., a laminate comprising multiple layers of the recited material, with or without layers of additional materials). In addition to the above-mentioned connotations, the term "on" can denote that a structural element is attached, connected, joined or otherwise associated with another element in any manner maintaining the elements in proximity to one another. A structural element described as "on" another can be integral to, or separate/distinct from the other element, and the elements can be associated permanently, irreversibly, etc., or removably, separably, etc. Use of the terms "one or more," "at least one," and the like with respect to an object or element does not in any way indicate the absence of a potential plural arrangement of objects or elements in connection with instances in which such term(s) are not used.

The term "microelectromechanical systems (MEMS) device," as used herein, refers generally to any such device at any stage of manufacture, including "pre-release" devices (e.g., devices having one or more sacrificial layers which are removed at subsequent processing steps) and "post-release" devices (e.g., devices comprising the structural elements of the operational device). While various embodiments may be described with reference to a particular structure or device, methods and products provided herein are not limited to the exemplified devices or any particular class of device, but rather are generally applicable to any compatible MEMS device.

In some preferred embodiments, the MEMS device manufactured by methods provided herein is an interferometric modulator, such those illustrated in FIGS. 1-9. However, methods provided herein are not limited to such devices, but rather may also be applicable to interferometric modulators having an "inverse" configuration, such as those described in U.S. Pat. No. 6,650,455, "multi-state" interferometric modulators, such as those described in U.S. Patent Pub. No. 20040240032, and/or other suitable MEMS devices.

Figure 9A:
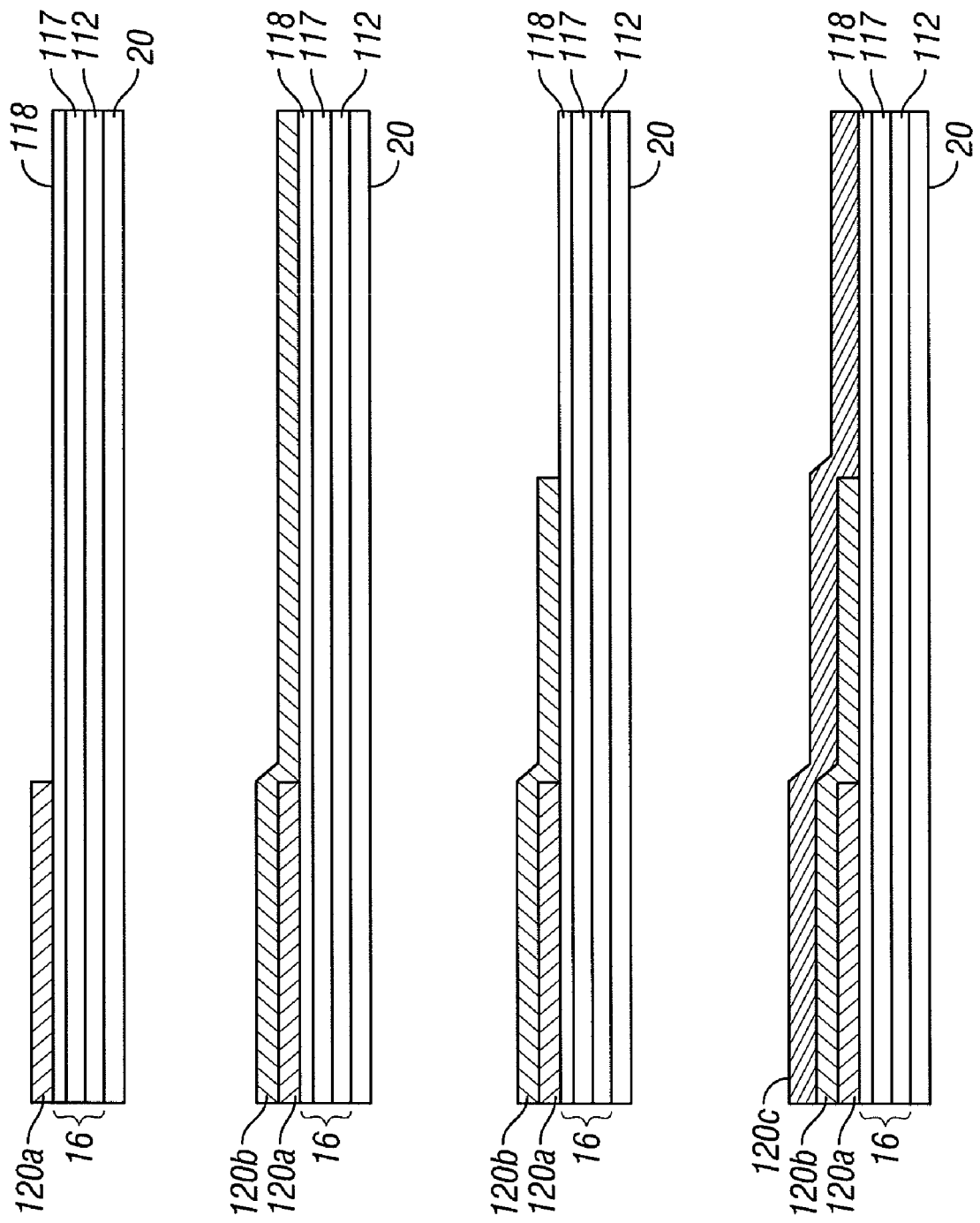
FIG. 9A shows a series of cross-sectional views illustrating the deposition, patterning and etching of multiple sub-layers of sacrificial materials in an embodiment of a method for making interferometric modulators with interferometric cavities of varying dimensions.
Figure 9B:
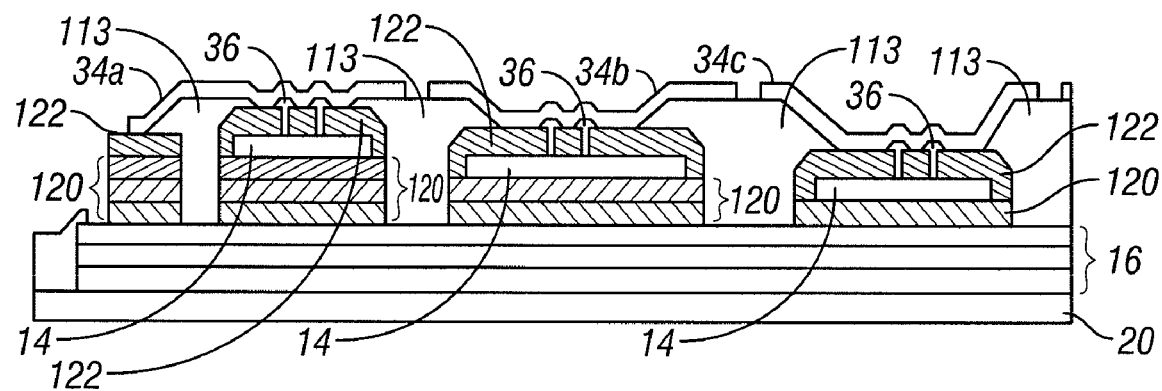
FIG. 9B is a cross sectional view showing three adjacent interferometric modulators comprising a pixel in a color display in the pre-release state of manufacture, prior to etching of the sacrificial layers.
Figure 9C:
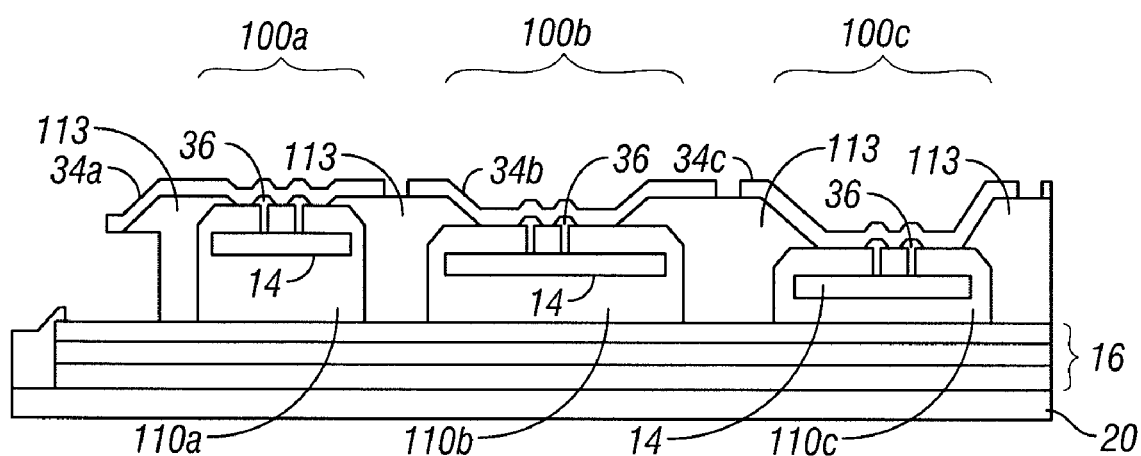
FIG. 9C is a cross sectional view showing the interferometric modulators of FIG. 9B, each in a relaxed state, after release by etching of the sacrificial layers.

FIGS. 9A-C are cross-sectional views illustrating several steps of an exemplary process for forming an array of interferometric modulators, each comprising a movable reflective layer 14 positioned over and spaced from an optical stack 16 via support posts 113, which are substantially perpendicular to the optical stack 16. The support posts 113, optical stack 16, and reflective layer 14 form the interferometric cavity 110. The cross-sections of FIGS. 9A-C show the formation of three interferometric modulators, 100(a), 100(b), and 100(c), which comprise a pixel in a color display device. The final configurations of the interferometric modulators formed by the exemplified process are shown in FIG. 9C. The dimensions of the interferometric cavities 110(a), 110(b), 110(c) of modulators 100(a), 100(b), and 100(c), respectively, determine the nature of the interference and the resulting color of light reflected by each modulator. For example, modulators 100(a), 100(b), and 100(c) have interferometric cavities 110(a), 110(b), and 110(c) of varying heights (e.g., distances between the movable reflective layer 14 and the optical stack 16 in the quiescent or relaxed state), with the heights of the cavities correlating with the wavelengths of light reflected. Thus, in an "RGB" pixel example, modulator 100(a) having the cavity with the largest height reflects red light, modulator 100(b) with the cavity of intermediate height reflects green light, and modulator 100(c) with the cavity of the smallest height reflects blue light. Other color combinations are also possible, as well as the use of black and white pixels.

In the illustrated process, an optical stack 16 is deposited on a transparent substrate 20, as shown in FIG. 9A. The optical stack 16 typically comprises several integrated or fused layers, including an electrode layer 112, formed on the substrate 20 by depositing an appropriate material, such as indium tin oxide (ITO), and a partially reflective layer 117 formed on top of the electrode layer 112 by depositing an appropriate material, such as chrome. In a process not shown here, the electrode and partially reflective layers 112, 117 may be patterned and etched to form electrode columns, rows and/or other useful shapes as required by the display design. The optical stack 16 also typically comprises a dielectric layer 118 formed over the patterned electrode 112 and partially reflective 117 layers. The dielectric layer 118 comprises an appropriate material, such as silicon oxide. In various embodiments, other materials are used to form the electrode, partially reflective, and/or dielectric layers. In the illustrated embodiment, the viewing surface of the transparent substrate 20 is on the 'bottom' of the substrate 20, i.e., the opposite side of the substrate 20 from the optical stack 16.

Formation of the optical stack is followed by deposition of a first sacrificial layer 120, which may comprise several sublayers (e.g., sublayers 120(a), 120(b), and 120(c), described below). In some embodiments, an etch stop layer (not shown), for example comprising $Al_2O_3$, is formed on the optical stack 16 prior to deposition of the first sacrificial layer 120 to protect the optical stack 16 from subsequent etching steps. With reference to FIG. 9B, the first sacrificial layer 120 occupies the space between the movable reflective layer 14 and the optical stack 16, and thus the thickness of the first sacrificial layer 120 corresponds to the dimensions of the interferometric cavity 110 in each interferometric modulator 100. FIG. 9A illustrates an exemplary process for creating first sacrificial layers 120 having variable thicknesses in each of the interferometric modulators 100(a), 100(b), and 100(c) by depositing, fabricating, and etching multiple sacrificial sub-layers 120(a), 120(b), and 120(c). In step 1 of the illustrated embodiment, the first sublayer 120(a) is deposited, masked and etched to form a portion of the first sacrificial layer of the left-most interferometric modulator 100(a). In steps 2 and 3, a second sacrificial sublayer 120(b) is deposited, patterned and etched to form a portion of the first sacrificial layers 120 of the interferometric modulators 100(a) and 100(b). Finally, in step 4, a third sacrificial sub-layer 120(c) is deposited to form a portion of the first sacrificial layers 120 of the interferometric modulators 100(a), 100(b), and 100(c). The third sublayer 120(c) need not be patterned, since its thickness is included in all three of the interferometric modulators 100(a), 100(b), and 100(c) comprising the pixel. Thus, in FIGS. 9A-C, the first sacrificial layer 120 of the left-most interferometric modulator 100(a) comprises the combined thickness of sublayers 120(a), 120(b), and 120(c), the first sacrificial layer 120 of the middle interferometric modulator 100(b) comprises the combined thickness of sublayers 120(b) and 120(c), and the first sacrificial layer 120 of the right-most interferometric modulator 100(c) comprises the thickness of sublayer 120(c).

The use of multiple sublayers to form one or more sacrificial layers in methods provided herein allows for the manufacture of interferometric modulators having a wide range of cavity dimensions, depending for example on the desired optical and electromechanical properties of the interferometric modulator. For example, adjacent interferometric modulators comprising a pixel within a display device can have interferometric cavity dimensions corresponding to the combined thicknesses of one, two, three or more sacrificial sublayers, such as the sublayers 120(a), 120(b), and 120(c) in FIGS. 9A-C. In addition, the sublayers comprising a sacrificial layer may have differing dimensions, allowing for additional variability in the total thicknesses of sacrificial layers comprised of such sublayers. The combined thickness of the one or more sublayer(s) forming the first sacrificial layer 120 can be wide ranging. In some embodiments, the sacrificial layer 120 has a combined thickness of from about 500 Angstroms to about 50,000 Angstroms, and more preferably from about several thousand Angstroms to about 10,000 Angstroms.

To form the pre-release structure illustrated in FIG. 9B, a metallic layer is deposited on the first sacrificial layer 120 (comprising one, two or three sub-layers), and is subsequently patterned and etched to form the movable reflective layer 14 of each interferometric modulator. In some embodiments, a second etch stop layer (not shown) is deposited between the first sacrificial layer 120 and the metallic layer (which subsequently forms reflective layer 14) to protect the first sacrificial layer 120 during the pattern etch of the metallic layer. A second sacrificial layer 122 is then deposited (and optionally planarized) on reflective layers 14 and the spaces between the reflective layers 14 (on first sacrificial layer 120). The second sacrificial layer 122 is subsequently masked and etched to form cavities extending through the second sacrificial layer to the optical stack 16 (through the first sacrificial layer), in which a structural material (e.g., a polymer, metal, or oxide) is deposited to form support posts 113. Support posts 113 are typically of a uniform height, achieved, for example by a planarization step (e.g., using chemical-mechanical planarization (CMP)) (not shown). Also formed are connections 36 between the reflective layers 14 and the deformable layers 34. The deformable layer is then deposited, patterned, and etched, for example as shown in FIGS. 8A and 8B.

As illustrated in FIG. 9B, the deformable layer 34 forms an elastic connection between the support posts 113 and the movable reflective layers 14. In some embodiments, a third sacrificial layer (not shown) is optionally deposited over the deformable layer 34. Etching of the sacrificial layers 120 and 122 "releases" the interferometric modulators so that the movable reflective layers 14 are suspended over the optical stack 16 by deformable layers 34, as illustrated in FIG. 9C.

In various embodiments, etching of one or more sacrificial layers of a MEMS device, such as sacrificial layers 120, 122, and the optional sacrificial layer over deformable layer 34, comprises exposing the sacrificial layer(s) to a gas phase chemical etchant in the presence of an ionized gas. In some embodiments, one or more surfaces of a MEMS device that were in contact with, or close proximity to, a sacrificial layer have a reduced level of fixed electrical charge. For example, with reference to FIG. 9C, etching of the sacrificial layer 120 according to methods provided herein prevents charging of surfaces of the movable reflective layer 14, optical stack 16, and/or support posts 113 exposed to the interferometric cavity 110. Still referring to FIG. 9C, surface charges can also be reduced on one or more surfaces exposed to the second sacrificial layer 122, including the upper surface of movable reflective layer 14, the lower surface of deformable layer 34, and/or surfaces of the support posts 113. Advantageously, methods disclosed herein prevent surface charges and their deleterious effects without the need for substantially departing from established manufacturing methods. Moreover, in some embodiments, the reduction of surface charges on one or more surfaces exposed to the interferometric cavity eliminates additional processing steps designed to eliminate, reduce, or compensate for surface charges, such as the deposition of additional layers or coatings.

Those skilled in the art will understand that the selection of the sacrificial material, the gas phase chemical etchant, and the ionized gas depends on a variety of factors, including the methods and conditions used to deposit the sacrificial materials (which can effect their physical and/or chemical properties), and the etching conditions used to remove them. Those skilled in the art will also understand that virtually all materials are etchable under certain conditions, and that the description herein of a material as selectively etchable or etch resistant, or of an etchant and/or ionized gas as being non-etching, is in comparison with other materials or gases under particular conditions. Thus, in many instances, appropriate sacrificial materials, etchants, and/or ionized gases are determined empirically, under controlled conditions. Alternatively, etchant-sacrificial material combinations useful for a variety of purposes are known in the art and/or are commercially available.

The gas phase etchant, ionized gas, and sacrificial material(s) used in methods provided herein are generally selected so that the sacrificial materials are selectively etchable against the structural materials and/or the substrate of the MEMS device, using the chemical etching methods provided herein. In some preferred embodiments, the gas phase chemical etchant is substantially non-etching against the structural materials and/or the substrate. For example, in some embodiments, the gas phase chemical etchant etches the sacrificial materials at a rate greater than about 5×, preferably greater than about 10×, and more preferably greater than about 40× the rate of the structural materials and/or the substrate. In further embodiments, the gas phase chemical etchant is substantially non-etching against the structural materials and/or the substrate in the presence of the ionized gas.

In some preferred embodiments, the ionized gas is substantially non-etching against the sacrificial materials. For example, in some embodiments, the ionized gas etches the sacrificial materials at a rate that is about 10× less or lesser, more preferably about 40× less or lesser, and even more preferably about 100× less or lesser than the rate of etching by the gas phase chemical etchant. Advantageously, using an ionized gas that is substantially non-etching against the sacrificial materials allows the MEMS device to be exposed to the ionized gas for extended periods during the manufacturing process. For example, in some preferred embodiments, the MEMS device is exposed to the ionized gas for a period of time prior to introduction of the chemical etchant, as well as throughout the etching process, to prevent formation of charged species in the absence of the ionized gas. In further embodiments, the MEMS device is exposed to the ionized gas prior to, during, and/or after the deposition of one or more sacrificial layers, for example to prevent triboelectric charge formation due to contacts between the sacrificial materials and the structural materials and/or the substrate. Advantageously, the use of an ionized gas that is substantially non-etching allows methods described herein to be carried out without the need to significantly alter established manufacturing protocols. For example, in various embodiments, one or more deposition and/or etching steps in the manufacture of a MEMS device is/are carried out in the presence of a substantially non-etching ionized gas under the same or substantially similar conditions used in the absence of the ionized gas.

While not being bound by a particular theory, it is believed that, in some embodiments, the degree of charge formation is related to the nature and extent of contacts between the sacrificial and structural materials. For example, in various embodiments, charge formation is affected by the area and duration of contact between surfaces, the rate and direction of separation, humidity, and/or "contact resistance" at the surface-surface interface. In some preferred embodiments, the degree of triboelectric charging is minimized by methods provided herein by etching under conditions in which the gas phase etchant spontaneously etches the sacrificial material via chemical processes (e.g., by converting the sacrificial material to volatile chemical species that are removed from the reaction chamber along with other etching byproducts), without substantial etching by physical processes (e.g., ion bombardment, sputtering, etc.). Thus, the sacrificial layer is preferably etched in a substantially isotropic (non-directional) manner, consistent with purely chemical etching processes.

In various preferred embodiments, chemical etching is carried out without substantial physical etching by performing the etching under substantially non-energized conditions. For example, etching conditions are preferably of sufficiently low energy to maintain the chemical etchant in the gaseous phase (e.g., without conversion to a plasma) throughout the etching process and any subsequent steps in which the etchant contacts the MEMS device. In various embodiments, the etching process is carried out without exposing the gas phase etchant to energizing conditions, such as elevated temperatures, elevated pressures, radiation (e.g., UV or other light), electromagnetic energy, and/or other conditions capable of energizing the gaseous etchant. For example, in various embodiments, etching according to methods provided herein is performed at a pressure of less than about 100 torr, more preferably less than about 50 torr, and even more preferably less than about 10 torr; at a temperature of less than about 200° C., more preferably less than about 150° C., and even more preferably less than about 100° C.; and/or for a duration of less than about 10 minutes, more preferably less than about 5 minutes, and even more preferably less than about 1 minute.

In some embodiments, the gas phase chemical etchant is a noble halide-fluoride gas etchant, such as a helium-, neon-, argon-, krypton-, xenon-, or radon-fluoride gas. In some preferred embodiments, the etchant is $KrF_2$, $XeF_2$, $XeF_4$, or $XeF_6$, with $XeF_2$ being particularly preferred. In some embodiments, the gas phase chemical etchant is a halogen-fluoride gas, such as $BrF_x$ (e.g., BrF, $BrF_3$, or $BrF_5$), $ClF_x$ (e.g., ClF, $ClF_3$, or $ClF_5$), $IF_x$ (e.g., $IF_5$ or $IF_7$), $XeF_x$ (e.g., $XeF_2$), or combinations thereof. In further embodiments, the gas phase chemical etchant comprises a gas phase acid, such as HF, HBr, or HI, a chlorine or bromine gas, such as $Cl_2$, $BrI_3$, $BrCl_3$ or $AlCl_3$, or any combination of the above etchants. In some embodiments, the etchant further comprises an additional gaseous component (e.g., a diluent). For example, the gas phase chemical etchant can be combined with $N_2$ gas or another inert gas, such as Ar, Xe, He, and the like.

A variety of sacrificial materials can be chemically etched by methods provided herein without substantial etching via physical processes. For example, in various embodiments, the sacrificial material may comprise polycrystalline silicon, amorphous silicon, silicon oxide, silicon nitride, aluminum, titanium, zirconium, hafnium, vanadium, tantalum, chromium, molybdenum, tungsten, manganese, various polymers (e.g., organic polymers), and/or combinations thereof. In some embodiments, the sacrificial material comprises a sacrificial layer, such as the sacrificial layer 120 in FIG. 9B, which can be formed by a chemical process, such as chemical vapor deposition (CVD) or low pressure CVD (LPCVD), or by other processes, such as physical vapor deposition (PVD). In some preferred embodiments, the sacrificial layer 120 comprises molybdenum, silicon, titanium or tungsten, and is etched to release the interferometric modulator using a noble halide-fluoride gas etchant, such as $XeF_2$.

As described above, the selection of sacrificial materials and chemical etchants may require empirical determination of the etch rates of the sacrificial material relative to various structural materials under defined conditions. Accordingly, various examples described herein provide general guidelines for the selection of such materials, but should not be construed as universally applicable or exhaustive of useful materials. In some embodiments, etching is monitored, for example by measuring the reflectivity of the device, or the release of etching byproducts. In other embodiments, the etching is allowed to proceed for a fixed duration, for example a duration previously determined to provide a desirable degree of etching and/or selectivity. Those skilled in the art will also understand that the etching rate of a layer of sacrificial material can vary based on the thickness of the layer, the spacing and orientation of surrounding layers, the direction of etching, and other factors. In various embodiments, the amount of a gas phase etchant used to etch a sacrificial layer is an amount sufficient to etch the sacrificial material at a desired rate, for example at least 1 nm/sec, and more preferably at least 5 nm/sec, and even more preferably at least 10 nm/sec or more. In various embodiments, the amount of ionized gas used in methods described herein is between about 1% and about 99% by weight of the etchant-ionized gas mixture, and preferably less than about 50%, or more preferably less than about 25%, or even more preferably less than about 10% by weight of the etchant-ionized gas mixture. Skilled artisans can readily determine etchant-ionized gas ratios, etching conditions, and the like for particular MEMS devices by routine experimentation, in light of the teachings provided herein.

In various embodiments, the ionized gas is an ionized inert gas, such as $N_2$, Ar, Xe, He, and the like. In some preferred embodiments, the ionized gas is substantially non-reactive (e.g., substantially non-etching) against sacrificial and/or structural materials comprising the MEMS device. In further embodiments, the ionized gas is substantially non-etching against such materials in the presence of the gas phase chemical etchant. The ionized gas preferably comprises both positively and negatively charged molecules, in order to neutralize both types of charged species during the etching process. However, in some embodiments, the ionized gas may be comprised substantially or wholly of either positively or negatively charged molecules, for example where ionized gases of a certain composition have been previously established as being effective in reducing surface charges.

Methods and apparatuses for producing ionized gases and delivering them to a targeted microenvironment are known in the art, and are described, e.g., in U.S. Pat. Nos. 5,594,247 and 5,898,268. For example, in some embodiments, an inert gas is ionized by a "corona discharge" method, wherein the gas is exposed to needle shaped electrodes that ionize the gas molecules upon application of an ionizing voltage to the electrodes. In some embodiments, a negative voltage is applied to one or more electrodes, producing primarily positive ions, whereas in other embodiments a positive voltage is applied, producing primarily negative ions. Mixtures of positive and negative ions can be produced by mixing negative and positive ionized species produced as described above, and/or by applying an alternating current to a single electrode, preferably with a temporal pulse-pause protocol designed to maximize the yield of both species (e.g., by minimizing recombination of charged species). In various embodiments, ionized species are directed to an etching chamber or other microenvironment containing a MEMS device by applying vacuum, pressure, and/or electromagnetic forces, and/or by other methods known in the art. In some embodiments, the ionized gas is introduced to the etching chamber using an ion gun, a variety of which are known in the art and commercially available.

In some preferred embodiments, the inert gas has a low "ionization energy," such that it is readily ionized under relatively low-energy conditions, for example at ambient temperatures and pressures. $N_2$ and Ar gases are particularly preferred in some embodiments. In some preferred embodiments, the ion source is placed in close proximity to the area targeted for charge reduction, since gases having a low ionization energy typically recombine readily to form uncharged species. In addition, in further embodiments, ionized gas molecules are accelerated towards the target area, for example using an ion gun, so that the ionized molecules reside in the etching chamber for a substantial portion of their 'half-life'.

It will be understood by skilled artisans that MEMS devices can be exposed to the gas phase chemical etchant and the ionized gas in a variety of ways, depending on the particular device being manufactured, the equipment and materials being utilized, etc. For example, a number of methods and apparatuses are known in the semiconductor, MEMS, and integrated circuit fields for controlling the microenvironment surrounding a device during one or more steps of its manufacture. For example, various steps in the manufacture of a MEMS device can be carried out in separate, sealed microenvironments within which one or more specific processing steps are carried out (e.g., processing "tools").

In some embodiments, etching according to methods provided herein is carried out in a sealed etching chamber, which allows gases and particulate matter to be introduced and removed from the chamber in a controlled manner, and at a controlled rate. To minimize the formation of surface charges, the gas phase etchant is preferably introduced to the etching chamber in a manner that minimizes its exposure to sacrificial materials in the absence of the ionized gas. Thus, in some preferred embodiments, the ionized gas is dispersed throughout the chamber prior to introducing the gas phase etchant. For example, the ionized gas can be continuously circulated through the etching chamber and the gas phase etchant can be bled into the circulation of the ionized gas. In other embodiments, the gas phase etchant and the ionized gas are introduced to the chamber together (e.g., each gas can flow from a separate source into a common conduit, which in turn carries the mixture to the etching chamber), or are combined in the etching chamber (e.g., each gas can be introduced into the chamber from a separate source). In some preferred embodiments, the etchant is $XeF_2$, which can be produced by sublimation from solid crystals, for example by maintaining the crystals at room temperature.

Figure 10:
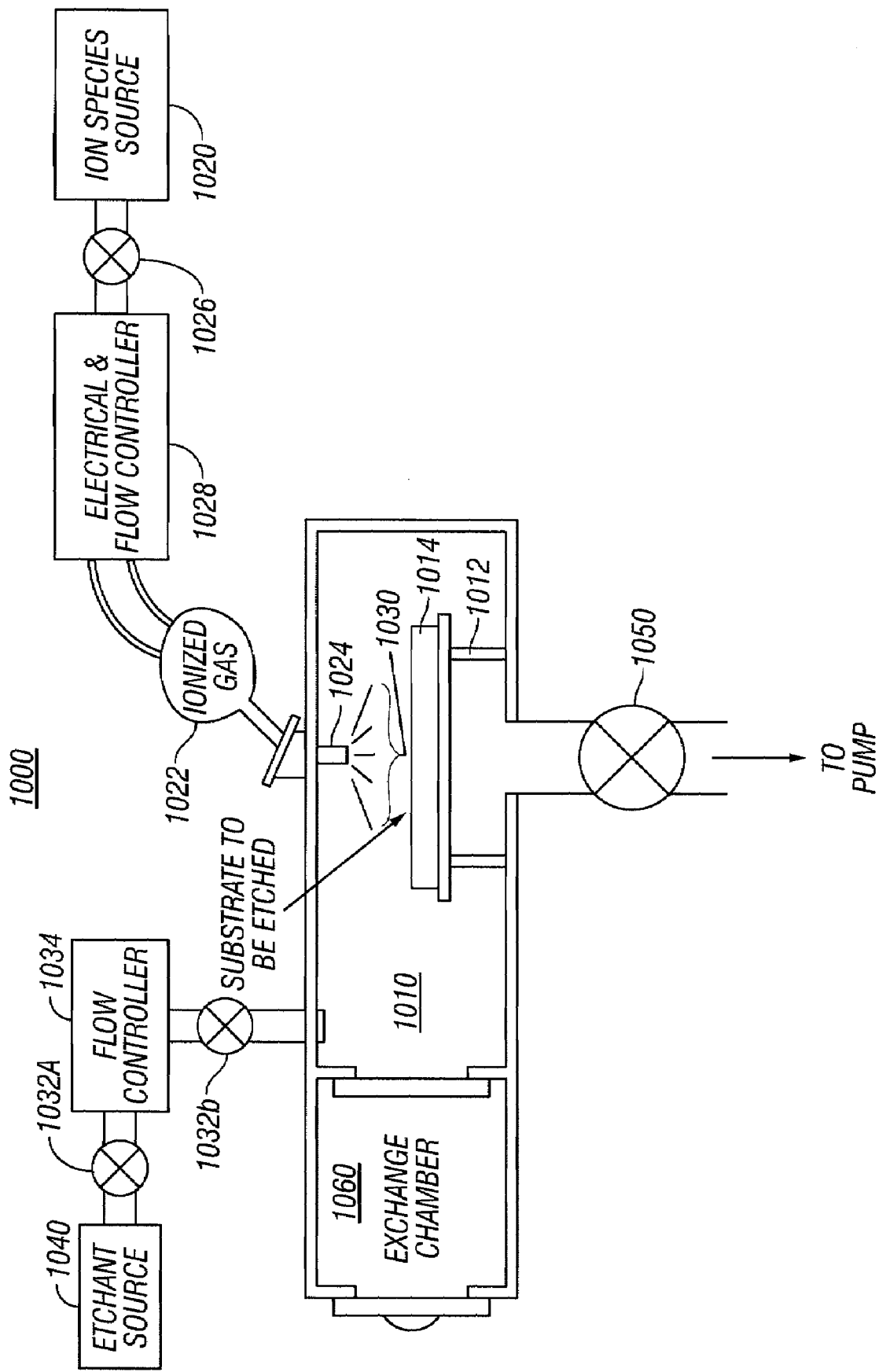
FIG. 10 illustrates an apparatus for etching a MEMS device substrate that is supplied with an ionized gas for reducing and/or preventing surface charges.

FIG. 10 illustrates an exemplary etching apparatus 1000, which includes a reaction chamber 1010 having a stage 1012 on which a substrate to be etched 1014 is mounted. The stage 1012 is electrically grounded to prevent surface charge formation and to discharge existing surface charges. An ion species source 1020 supplies a source gas (e.g., argon) 1022 to ion gun 1024, which ionizes the source gas 1022 and delivers it as an ion beam 1030 into the reaction chamber 1010. A gas supply valve 1026 controls the flow of the source gas 1022 from the ion species source 1020, under the control of the source gas electrical and flow controller 1028. The source gas controller 1028 also controls the supply of electrical power to the ion gun 1024. The ion gun 1024 generates the ion beam 1030, comprising the ionized gas 1022, and directs it to the exposed surfaces of the etching substrate 1014. An etchant source 1040 supplies one or more etching gases into the reaction chamber 1010, under the control of etching gas supply valve 1032a and 1032b and an etching gas flow controller 1034. The reaction chamber 1010 is connected to a discharge pump (not shown), which applies vacuum pressure to the reaction chamber 1010 under the control of the discharge pump valve 1050, to facilitate removal of etch by-products. The reaction chamber 1010 is also connected to an exchange chamber 1060, which isolates the etching chamber 1010 from the external environment during the loading and unloading of the chamber 1010 with etching substrates (e.g., 1014). A variety of ion species sources, ion guns, etching gas sources, controllers, and the like are well known in the art, and can be obtained from commercial sources.

Figure 11:
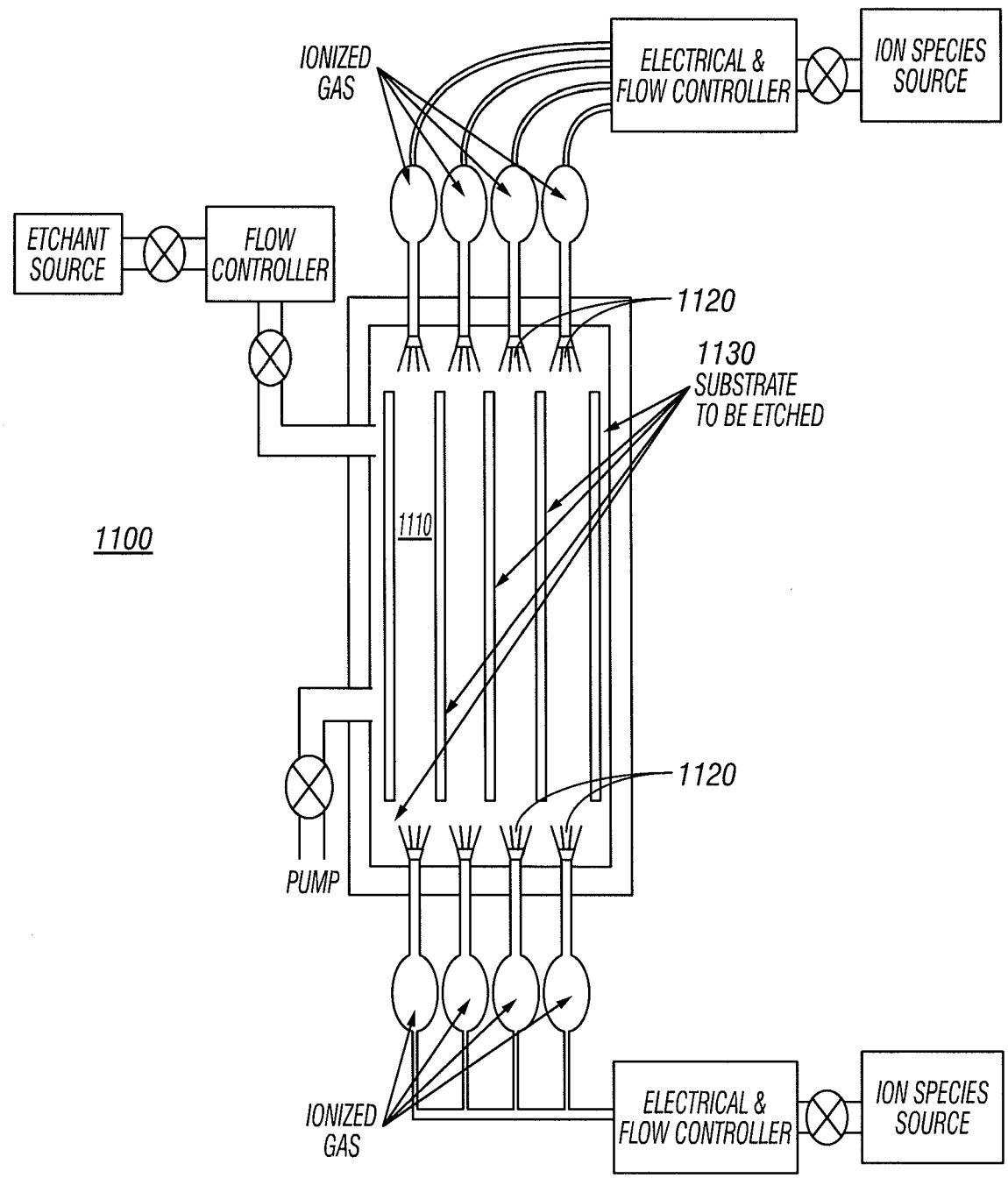
FIG. 11 illustrates an etching apparatus similar to the apparatus of FIG. 10 which facilitates the simultaneous processing of multiple MEMS device substrates.

FIG. 11 illustrates an etching apparatus 1100 similar to that shown in FIG. 10, having multiple ion guns 1120 to facilitate the delivery and/or distribution of the ionized gas within the etching chamber 1110 to allow simultaneous processing of multiple substrates 1130.

Figure 12:
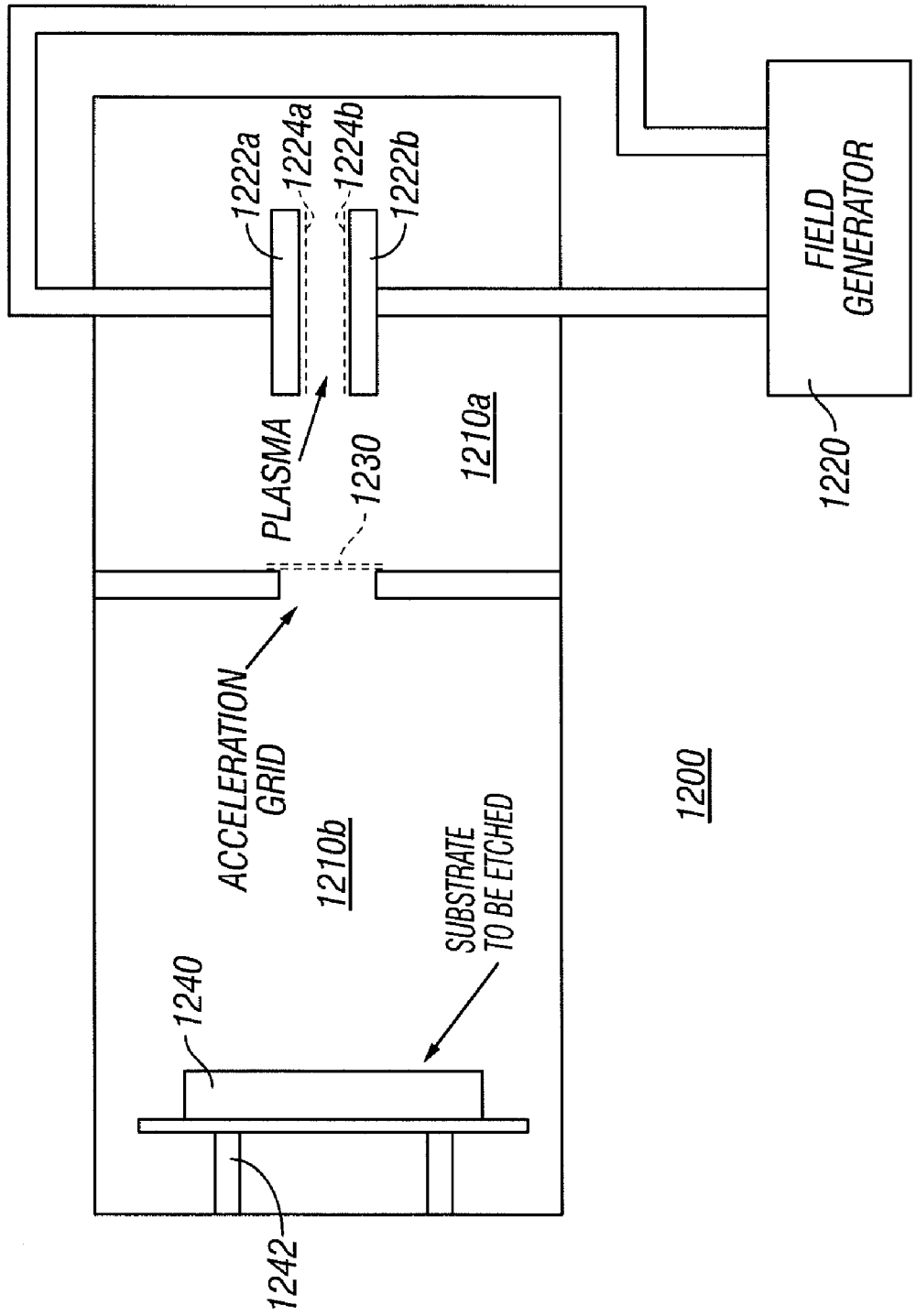
FIG. 12 illustrates the interior chamber of an etching apparatus, which allows independent control over the production of an ionized gas and its delivery to a MEMS device substrate.

FIG. 12 illustrates an etching chamber 1200 within an apparatus similar to those shown in FIGS. 10 and 11, wherein the chamber 1200 comprises a first sub-chamber 1210a, in which the ionized gas is generated, and a second sub-chamber 1210b, in which the substrate to be etched 1240, residing on electrically grounded stage 1242, is exposed to the ionized gas. In sub-chamber 1210a, an inert gas (e.g., argon) is exposed to a high voltage produced by field generator 1220, converting the inert gas into a plasma which yields the ionized gas. In the illustrated embodiment, the generation of the ionized gas within sub-chamber 1210a can be controlled independently of the flow of the ionized gas to the etching substrate 1240. For example, the production of the ionized gas can be controlled by varying the voltage produced by field generator 1220 and/or the voltage applied to the cut-off grids 1224a and 1224b. Without being limited to a particular mechanism, in some embodiments, the application of a voltage to electrodes 1222a and 1222b accelerates charged particles within sub-chamber 1210a, which collide with and ionize molecules of the inert gas to form a plasma. The generation of gas ions can be controlled by adjusting the voltage applied to the cut-off grids 1224a and 1224b. This level of control is independent of the control over the flow of the ionized gas into sub-chamber 1210b, which can be controlled by varying the voltage applied to the electrostatic acceleration grid 1230 separating sub-chambers 1210a and 1210b.

Methods provided herein are useful for reducing surface charges on any surface of a MEMS device that contacts a sacrificial layer during the manufacturing process. For example, with reference to FIG. 9B, etching the sacrificial layers 120 and 122 in the presence of an ionized gas can reduce surface charges on one or more surfaces exposed to the interferometric cavity 110, including the reflective surface of the movable reflective layer 14, the exposed surface of the optical stack 16, and/or one or more surfaces behind the reflective layer 14 (i.e., opposite the viewing surface).

In some preferred embodiments, methods provided herein reduce surface charges on one or more surfaces ("optically active" surfaces) within the optical path of an interferometric modulator. As described above with reference to FIG. 1, interferometric modulators typically reflect light from the movable reflective layer 14 that interferes in various degrees with light reflected by the optical stack 16, which is partially reflective and partially transmissive to incident light. Thus, the exposed surface of the optical stack 16 and/or the reflective surface of movable reflective layer 14 have certain optical properties, such as the ability to reflect, absorb, and/or transmit particular wavelengths of light, that are consistent with the desired optical response of the interferometric modulator. Accordingly, the accumulation of charges and/or particulate contaminants on one or more optically active surfaces of an interferometric modulator or other MEMS device can interfere with image fidelity, resolution, contrast, and/or other aspects of the optical performance of the device. Moreover, compensating for surface charges on optically active surfaces can be difficult, since materials and structural configurations are limited by the optical requirements of the device. Thus, in various preferred embodiments, the prevention of charge formation on one or more optically active surfaces can substantially improve the performance of MEMS devices.

In further preferred embodiments, methods provided herein reduce surfaces charges on one or more surfaces that are movable during the operation of a MEMS device ("mechanically active" surfaces). For example, in some embodiments, charged particles can adhere to and locally deform the mechanical layer of an interferometric modulator (e.g., the layer 34 in FIG. 9B), thereby altering one or more of its mechanical properties, such as the strain energy and/or the restoring force. As described above, the mechanical properties of the deformable layer are important for determining actuation voltages, the "hysteresis window," and other operational parameters of interferometric modulators. Thus, the prevention of charge formation on mechanically-active layers, such as the layer 34, can significantly improve the performance of interferometric modulators and/or other MEMS devices.

In further preferred embodiments, methods provided herein reduce surfaces charges on one or more structural elements comprising an insulating material. For example, in some embodiments, the optical stack 16 in FIG. 9B comprises an insulating layer exposed to the interferometric cavity 110. Because insulating layers are typically not susceptible to discharge via grounding, surface charges that develop on insulating layers become static surface charges, which can have a variety of deleterious effects, as described herein. Advantageously, etching sacrificial materials, such as those comprising the sacrificial layer 120, with a gas phase chemical etchant in the presence of an ionized gas according to methods described herein prevents the formation of surface charges on one or more insulating layers of a MEMS device.

In some additional aspects, MEMS devices produced by methods described herein are provided, as well as systems incorporating such devices. MEMS devices with reduced amounts of surface charges can exhibit a variety of improved characteristics, including but not limited to, reduced corrosion, erosion, and/or wear, better optical and/or mechanical properties, improved adherence to manufacturing tolerances, and other desirable properties.

Those skilled in the art will understand that changes in the apparatus and manufacturing process described above are possible, for example, adding and/or removing components and/or steps, and/or changing their orders. Moreover, the methods, structures, and systems described herein are useful for fabricating other electronic devices, including other types of MEMS devices, for example, other types of optical modulators.

Moreover, while the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. As will be recognized, the present invention may be embodied within a form that does not provide all of the features and benefits set forth herein, as some features may be used or practiced separately from others.

We claim:

1. A method of manufacturing a MEMS device, the method comprising:
    depositing a sacrificial material on a substrate;
    depositing a structural material over the sacrificial material; and
    etching the sacrificial material, the etching comprising exposing the sacrificial material to a gas phase chemical etchant in the presence of ionized gas, the ionized gas being substantially non-reactive with the sacrificial material, wherein the etching further comprises substantially removing the sacrificial material to form a structural layer suspended over the substrate, the structural layer comprising at least a portion of the structural material, and wherein the structural layer is movable between a first position spaced from the substrate by a first distance and a second position spaced from the substrate by a second distance.

2. The method of claim 1, wherein the structural layer moves from the first position to the second position in response to a first voltage difference between the substrate and the structural layer, and from the second position to the first position in response to a second voltage difference between the substrate and the structural layer, the second voltage difference being lower than the first voltage difference.

3. The method of claim 2, wherein exposing the sacrificial material to the gas phase chemical etchant in the presence of ionized gas reduces the difference between the first and second voltage.

4. The method of claim 1, wherein the structural layer is at least partially reflective to incident light.

5. The method of claim 4, wherein the substrate comprises a reflective layer, the reflective layer being at least partially transmissive and at least partially reflective to incident light.

6. The method of claim 5, wherein at least a portion of the light reflected by the structural layer interferes with at least a portion of the light reflected by the reflective layer.

7. The method of claim 6, wherein the MEMS device is an interferometric modulator, the movement of the structural layer between the first and second positions modulating the interference of light reflected from the structural layer with light reflected from the reflective layer.

8. A method of manufacturing a MEMS device, the method comprising:
    depositing a sacrificial material on a substrate;
    depositing a structural material over the sacrificial material; and
    etching the sacrificial material, the etching comprising exposing the sacrificial material to a gas phase chemical etchant in the presence of ionized gas, the ionized gas being substantially non-reactive with the sacrificial material, wherein exposing the sacrificial material to the gas phase chemical etchant in the presence of the ionized gas comprises:
    applying the ionized gas to the sacrificial material, and
    applying the gas phase chemical etchant to the sacrificial material; and
    wherein the gas phase chemical etchant and the ionized gas are applied to the sacrificial material sequentially.

* * * * *

UNITED STATES PATENT AND TRADEMARK OFFICE
CERTIFICATE OF CORRECTION

PATENT NO. : 7,763,546 B2  
APPLICATION NO. : 11/462026  
DATED : July 27, 2010  
INVENTOR(S) : Kothari et al.

Page 1 of 1

It is certified that error appears in the above-identified patent and that said Letters Patent is hereby corrected as shown below:

Title Page; item (56);

Page 3, Col. 2, Line 49 – Under U.S. Patent documents change "Jr." to --Jr., deceased--.

Page 6, Col. 1, Line 10 – Under Other Publications, change "Aluminoa" to --Alumina--.

Page 6, Col. 1, Line 22 – Under Other Publications, change "compatable" to --compatible--.

Page 6, Col. 1, Line 26 – Under Other Publications, change "vo" to --vol.--.

Page 6, Col. 1, Line 30 – Under Other Publications, change "Quanum" to --Quantum--.

Page 6, Col. 1, Line 40 – Under Other Publications, change "IEE," to --IEEE,--.

Page 6, Col. 1, Line 57 – Under Other Publications, change "Maniature" to --Miniature--.

Page 6, Col. 1, Line 60 – Under Other Publications, change "Internatioal" to --International--.

Page 6, Col. 1, Line 61 – Under Other Publications, change "Youk" to --York--.

Page 7, Col. 1, Line 4 – Under Other Publications, change "microelectomechanical systems" to --microelectromechanical systems--.

Page 7, Col. 1, Line 5 – Under Other Publications, change "Comparision" to --Comparison--.

Col. 1, Line 17 – Change "and or" to --and/or--.

Col. 6, Line 27 – Change "respectively" to --respectively.--.

Col. 7, Line 54 – Change "ore more device s" to --or more devices--.

Signed and Sealed this  
Twenty-fifth Day of January, 2011

David J. Kappos  
*Director of the United States Patent and Trademark Office*